(12) United States Patent
Diaz et al.

(10) Patent No.: US 6,219,235 B1
(45) Date of Patent: Apr. 17, 2001

(54) ELECTRONIC ASSEMBLY FOR STANDARD RACK ENCLOSURES

(75) Inventors: Randall J. Diaz, Gilroy; Perry L. Hayden, Salinas, both of CA (US)

(73) Assignee: Compaq Computer Corporation, Houston, TX (US)

( * ) Notice: Subject to any disclaimer, the term of this patent is extended or adjusted under 35 U.S.C. 154(b) by 0 days.

(21) Appl. No.: 09/314,610

(22) Filed: May 19, 1999

(51) Int. Cl.$^7$ .................................................. H05K 7/20

(52) U.S. Cl. ................... 361/695; 174/72 A; 312/223.2; 361/730; 361/752; 361/796

(58) Field of Search .................................. 174/55, 58–59, 174/69, 72 A, DIG. 9; 361/608, 690, 694–695, 725–727, 730, 752–753, 796–797, 825–827; 312/223.2

(56) References Cited

U.S. PATENT DOCUMENTS

| 2,434,918 | * | 1/1948 | Gall | 174/72 A |
| 5,070,429 | * | 12/1991 | Skirpan | 174/59 |
| 5,243,493 | * | 9/1993 | Jeng et al. | 361/390 |
| 5,466,059 | * | 11/1995 | Liu | 361/725 |

* cited by examiner

*Primary Examiner*—Gregory Thompson
(74) *Attorney, Agent, or Firm*—Fenwick & West, LLP

(57) ABSTRACT

An apparatus for receiving cables includes a chassis assembly including a base with a defined opening, and a bulkhead coupled to the base and located adjacent to the defined opening. The bulkhead includes a plurality of apertures capable of receiving an increased number of ports. A method of forming an electronic assembly, includes forming a chassis assembly from a metal sheet. The chassis assembly includes a base with a defined opening. The method further includes forming bulkhead on the base and adjacent to the defined opening. The bulkhead includes a plurality of apertures for receiving ports.

23 Claims, 22 Drawing Sheets

ELECTRONIC ASSEMBLY FOR STANDARD RACK ENCLOSURES

FIELD OF THE INVENTION

The present invention relates generally to electronic assemblies, and more particularly to an improved electronic assembly including an input/output bulkhead that can support an increased number of ports and can reduce the difficulties in cable adjustment and installation.

BACKGROUND OF THE INVENTION

Electronic assemblies contain various electronic components that are used in many applications. For example, electronic assemblies contain components that collectively function as switches or router-hubs in network systems. A standard Electronic Industries Association (EIA) 19" form-factor rack may be used to support a plurality of electronic assemblies.

FIG. 1a illustrates a conventional electronic assembly 50 including a chassis assembly 55 that encloses a motherboard 60, at least one daughter-card 65, a power supply 70, blowers 75, and other components. Ports 80 are attached to the daughter-card 65 and protrude through apertures in the rear panel 85 of the chassis assembly. The ports 80 serve as interfaces between external cable lines and the wiring boards 60 and 65 that support the electronic components in the electronic assembly 50.

One drawback of the conventional electronic assembly 50 is the number of ports 80 that can be positioned across the width of the electronic assembly 50 is limited by the 19" mounting rail width of the rack opening. The number of ports 80 in such an electronic assembly is typically limited to a small number, for example, six (6) ports with a 60-position D-sub miniature connectors. Therefore, a conventional electronic assembly is unable to implement a larger-size printed wiring board (PWB) which desirably could support additional ports.

Another drawback arises when the conventional electronic assembly 50 is mounted on a standard rack. Access to the ports 80 from the rear of the rack is difficult or not possible, particularly if the rear of the rack is placed against the wall or if the electronic assembly does not extend to the full depth of the rack. Additionally, from the front side of the rack, it is difficult to manually reach the ports 80 if they are located at the rear. As a result, it is difficult to install, disconnect, or adjust cables that interface with the ports 80.

Typically, all cables egress and air exhaust occur in the rear panel. This leads to limited access to cables and increased impedance to air exhaust. Moreover, cable egress from the chassis is not controlled adequately and minimum bend radii violations often result, affecting data integrity.

Additionally, in the conventional electronic assembly 50, the ports 80 are disposed at the rear panel 85 of the chassis assembly 55 and, therefore, prevent a straight front-to-back flow of cooling ambient air. Typically, such conventional apparatus requires the use of the pressurized air-flow system 75, such as blowers which are more complex in design, contain more parts and are less commercially available in large quantities, thereby leading to higher cost. These blowers also have a high-noise attribute and have a stronger airflow driving capability (which leads to a higher power consumption). The blowers permit air to flow in a serpentine fashion within the chassis assembly 55 to cool the components within the chassis assembly. The direction of the air flow may be illustrated by arrows 90. The air will then exit through a side panel 95 of the chassis assembly 55. However, the pressurized air-flow system 75 leads to additional cost, power requirements, and noise, and is generally less efficient at cooling. A further drawback in the above-mentioned approach is a daughter-card 65 portion adjacent to the rear panel 85 may not be reached by the air flow for proper cooling. Additionally, the airflow 90 is blocked by rack rails or rack components as the airflow exits the side panel 95.

FIG. 1b illustrates another conventional electronic assembly 96 including a chassis assembly 97 that requires internal cables 98 that are routed from leads 99 to the motherboard 60 and the rear panel 92. The requirement of routing internal cables 98 internally within the chassis assembly 97 leads to increased cost and assembly time. In addition, it is more difficult and costly to repair and service the internal cables 98.

In the conventional electronic assembly 96 of FIG. 1b, external cables exit the front panel 93. This configuration adds to difficulties in accessing other electronic equipment on the same rack, since the external cables from the front panel 93 may interfere or block the other rack equipment.

Therefore, there is a need for an improved electronic assembly that can support a greater number of ports, permit easier access for cable installation, removal or adjustment, and provide a more efficient air flow configuration. There is also a need for an improved electronic assembly that achieves the above advantages while remaining compatible with standard form-factor racks, which are typically deeper that they are wide, and in this configuration, integration of motherboard features and function allows for lower assembly and per-piece part cost.

SUMMARY OF THE INVENTION

The present invention provides an improved electronic assembly that can support an increased number of ports, while remaining compatible with standard form-factor racks. One form of the electronic assembly includes a chassis assembly having a base with a defined opening, and a bulkhead coupled to the base and located adjacent to the defined opening. The bulkhead may include a plurality of apertures capable of receiving an increased number of ports as compared to conventional assemblies. The ports couple the printed wiring boards contained in the electronic assembly to external cable lines. The increased number of ports increases the functionality and the switching capability of the electronic assembly.

The opening formed in the base of the electronic assembly permits easy access to the ports and cables from beneath the assembly, particularly if the assembly is mounted on a slide on the rack. As a result, the present invention reduces the difficulties in attaching, adjusting or detaching the cables which interface with the ports. Furthermore, the present invention minimizes the stress and bending of cables that interface with the ports. The chassis assembly portion adjacent to the bulkhead provides sufficient space for cable routing while controlling the bend radius of cables.

The bulkhead of the chassis assembly may be formed from the base or floor of the chassis assembly. This feature leads to the following advantages. First, this feature provides dimensional accuracy for board mounting features located on both planes, since fabrication tolerance is minimized by a one-piece integrated chassis design. Thus, this feature leads to less difficulties in the manufacture of the chassis assembly. Second, an opening in the chassis assembly base is provided to permit easy access to the ports and cables during cable installation, removal, or adjustment. Thus, the present invention can be easily serviced, thereby leading to reduced costs and labor time and lessens the likelihood of damaged connectors and/or mis-connected cables and no-trouble-found service calls.

The present invention, as configured, also provides an electronic assembly with a "straight-through" air flow capability that leads to lower pressure losses and optimized thermal management within the electronic assembly. Air may be received through apertures formed in the chassis assembly front panel and may flow directly within the electronic assembly toward the rear panel of the assembly. The chassis base width does not span the full width of the rack opening, as in conventional assemblies. Therefore, the present invention can provide air flow to cool thermally-sensitive I/O components which may exist within the chassis assembly. Additional apertures for receiving air may also be formed in the bulkhead, thereby providing additional airflow to cool the components within the electronic assembly. The "straight-through" optimized air flow configuration permits the use of low cost air movers in the electronic assembly and also eliminates the higher-pressure air flow requirement of conventional approaches.

The present invention also provides a low-noise electronic assembly, thereby satisfying the rigorous acoustic regulations for office equipment. The low-noise feature is attained by avoiding the use of air movers capable of overcoming high back pressure and by use of lower RPM, lower cost muffin fans, for example, for cooling the components in the electronic assembly. The invention is also less expensive to implement, as compared to conventional devices. Implementation cost may be controlled by use of standard "off-the-shelf" components for selected parts of the electronic assembly, and by lowering part count through integration of function of particular components. For example, a single sheet of metal is used to form the bulkhead and chassis base.

The invention also provides a modular design that allows various types of interconnects and other components, as well as upgrades, while providing a platform (e.g., the chassis assembly) that may also be used for future versions of products that implement the present invention.

These, together with the various ancillary advantages and features which will become apparent to those skilled in the art as the following description proceeds, are attained by these novel apparatuses and methods, a preferred embodiment thereof shown with reference to the accompanying drawings, by way of example only, wherein:

BRIEF DESCRIPTION OF THE DRAWINGS

FIG. 2b is a front view of the rack-mounted electronic assembly of FIG. 2a;

FIG. 2c is a rear perspective view of the rear portion of a front panel or bezel that may be attached to the rack-mounted electronic assembly of FIG. 2a;

FIG. 3 is a top view of the rack-mounted electronic assembly of FIG. 2a

FIG. 6 is a rear view of the rack-mounted electronic assembly of FIG. 2a;

FIG. 7b is a bottom perspective view of the electronic assembly of FIG. 7a;

FIG. 7c is a side perspective view of the electronic assembly of FIG. 7a;

FIG. 9 is a rear perspective view of the chassis assembly of FIG. 8a;

FIG. 10 is a side view of the chassis assembly of FIG. 8a;

FIG. 11b is another side perspective view of the chassis assembly of FIG. 11a;

FIG. 11d is a top view of the chassis assembly of FIG. 11a;

FIG. 13b is a top view of the chassis assembly of FIG. 13a;

FIG. 14b is top view of the rack-mounted electronic assembly of FIG. 14a; and

DETAILED DESCRIPTION OF THE PREFERRED EMBODIMENTS

Figure 1A:
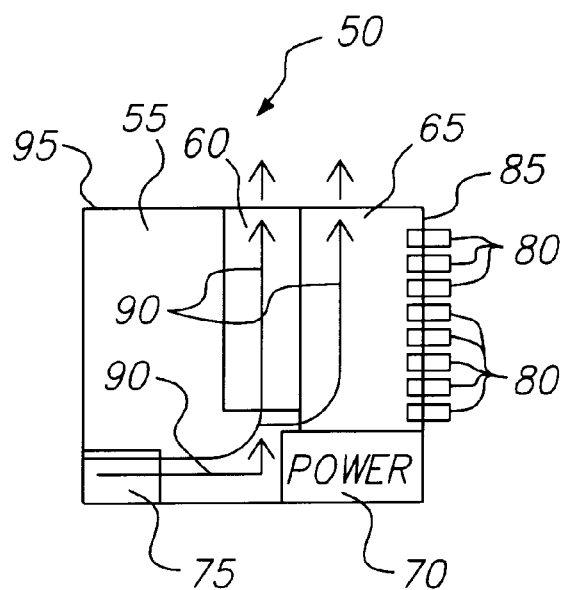
FIG. 1a is a top view of a conventional electronic assembly.
Figure 1B:
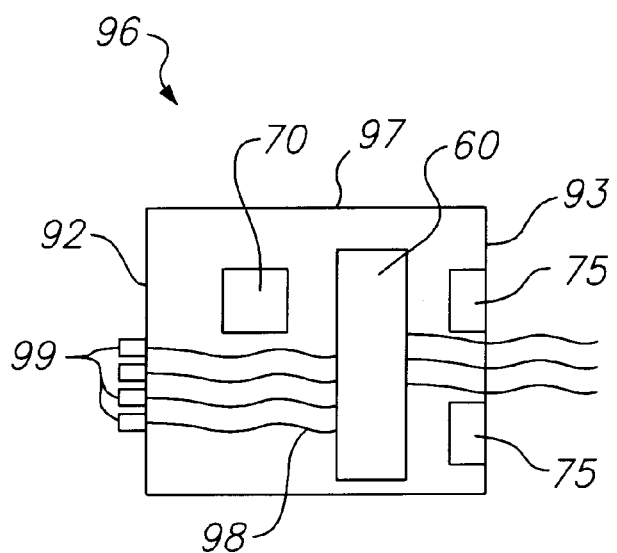
FIG. 1b is a top view of a conventional electronic assembly that requires internal cables to be routed. within the chassis assembly.
Figure 2A:
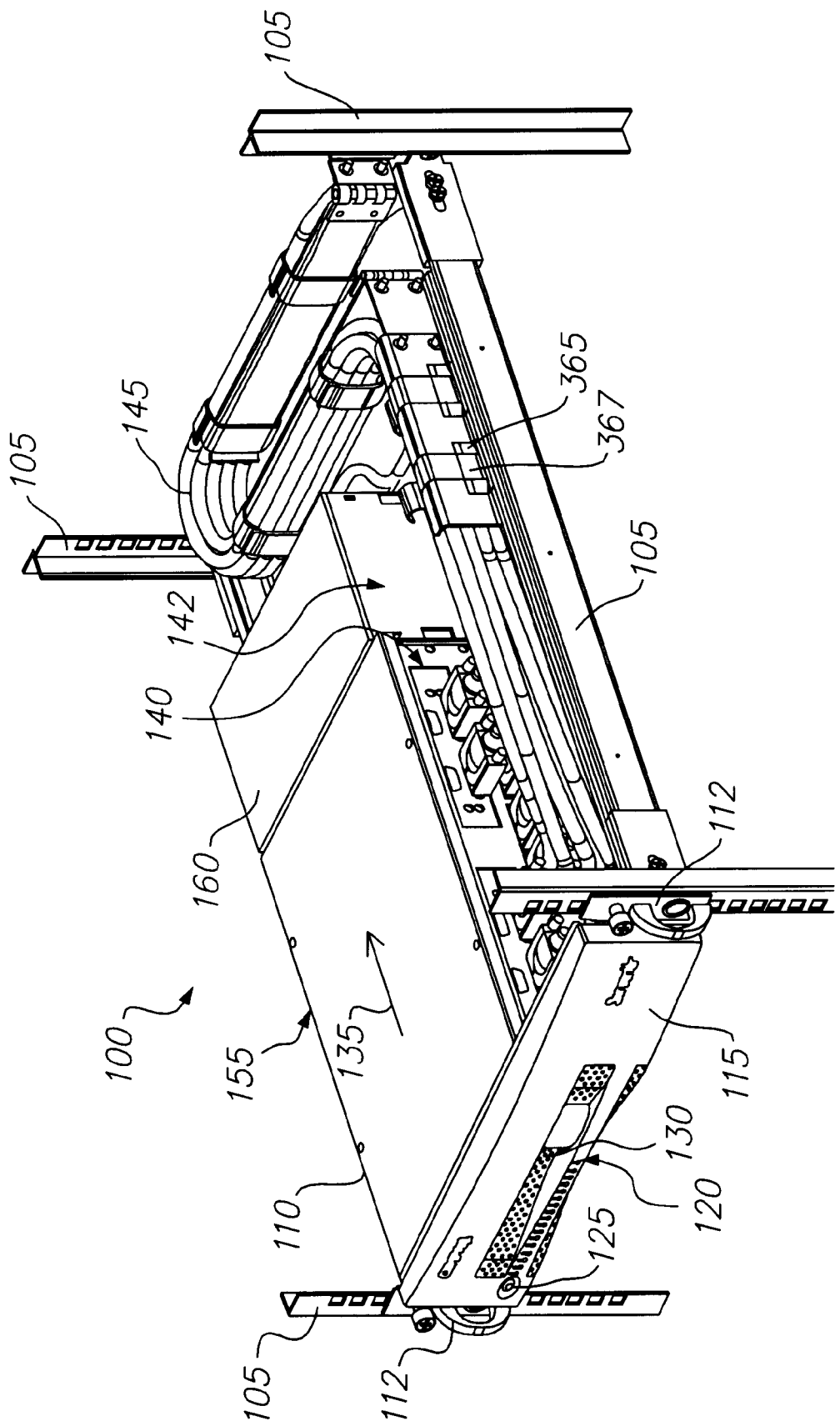
FIG. 2a is a side three-dimensional (3-D) view of a rack-mounted electronic assembly in accordance with an embodiment of the present invention.

FIG. 2a is a side perspective view of a rack-mountable electronic assembly 100 in accordance with an embodiment of the present invention. The electronic assembly 100 may, for example, be a 12-port switch for use in system area networks (SANs), and may also be mounted on a standard Electronic Industries Association (EIA) 19" form-factor rack 105. The rack 105 typically has a depth measurement of about 30 inches to 36 inches. However, as described below, the present invention may also be implemented as a table-top electronic assembly. The electronic assembly 100 may include a 2-U high EIA standard chassis assembly 110 for enclosing a printed wiring assembly (PWA) that forms the electronic and power path for a 12-port switch wherein 1-U is equal to 1.75 inches. Any suitable fasteners 112 may be used to hold the chassis assembly 110 on the rack 105.

A front panel 115 may be coupled to the chassis assembly 110 and may include air intake apertures 130 for permitting air to flow within the chassis assembly 110 in the direction of arrow 135. Additional details of the front panel 115 are described below with reference to FIGS. 2b and 2c.

Figure 11D:
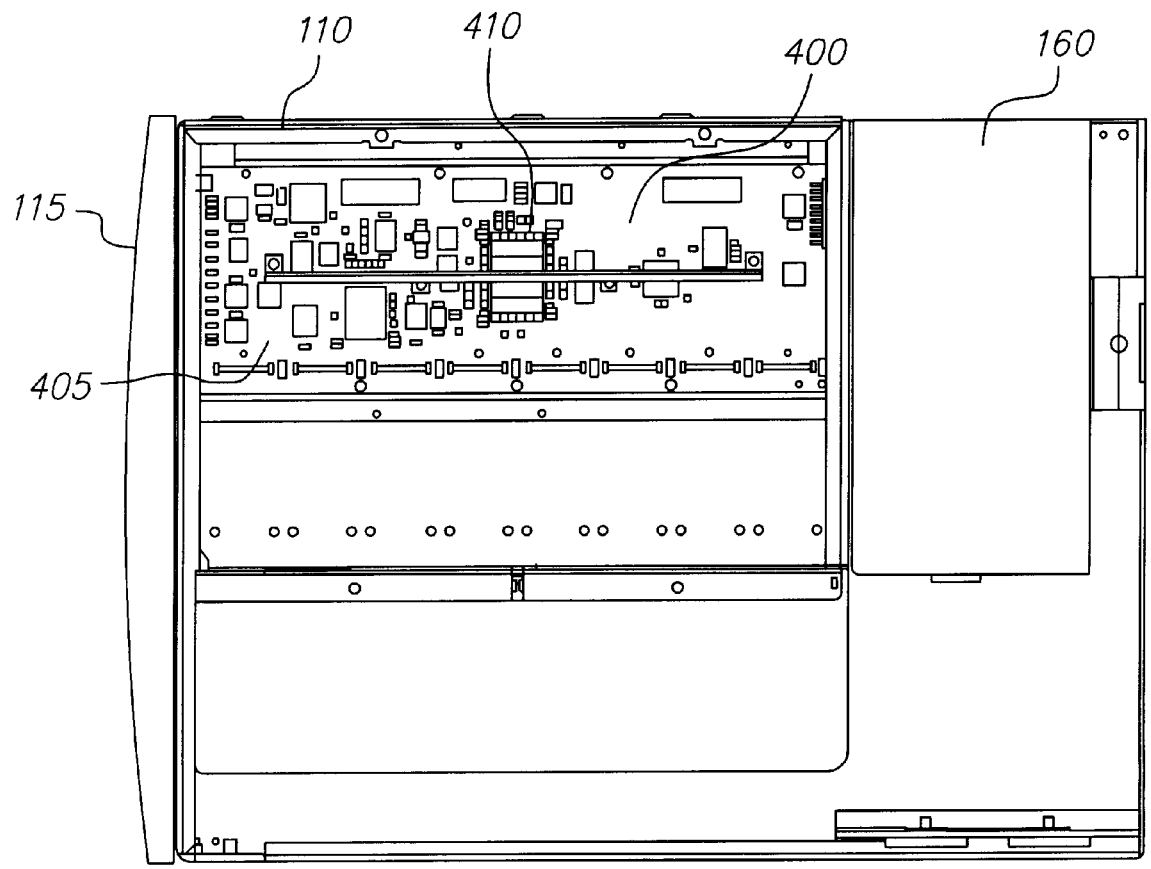
Figure 11A:
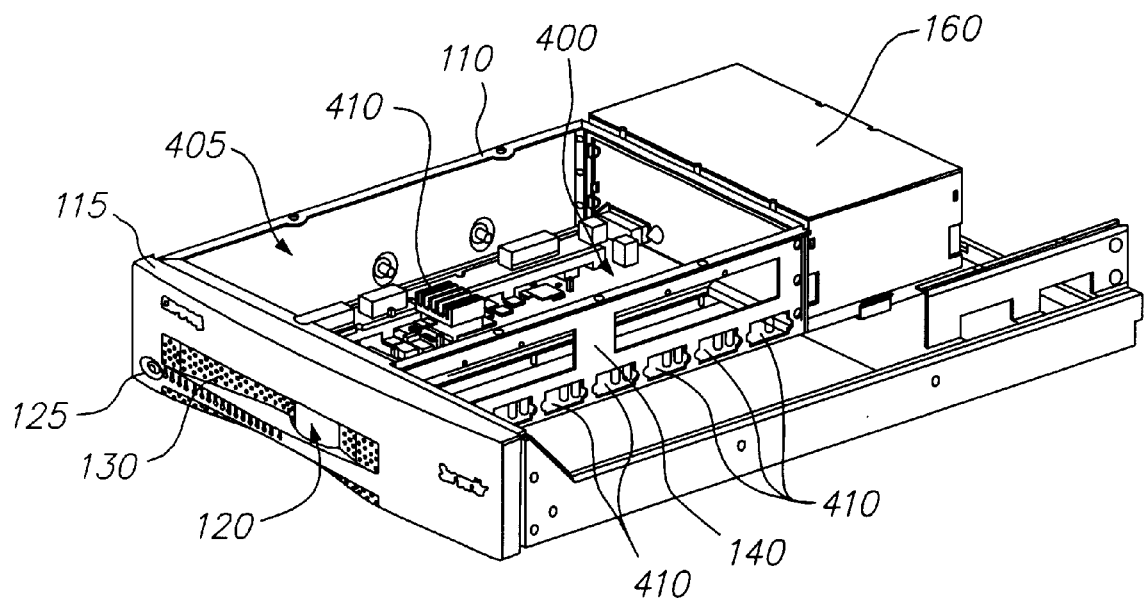
FIG. 11a is a side perspective view of a chassis assembly including a motherboard, in accordance with an embodiment of the present invention.
Figure 11B:
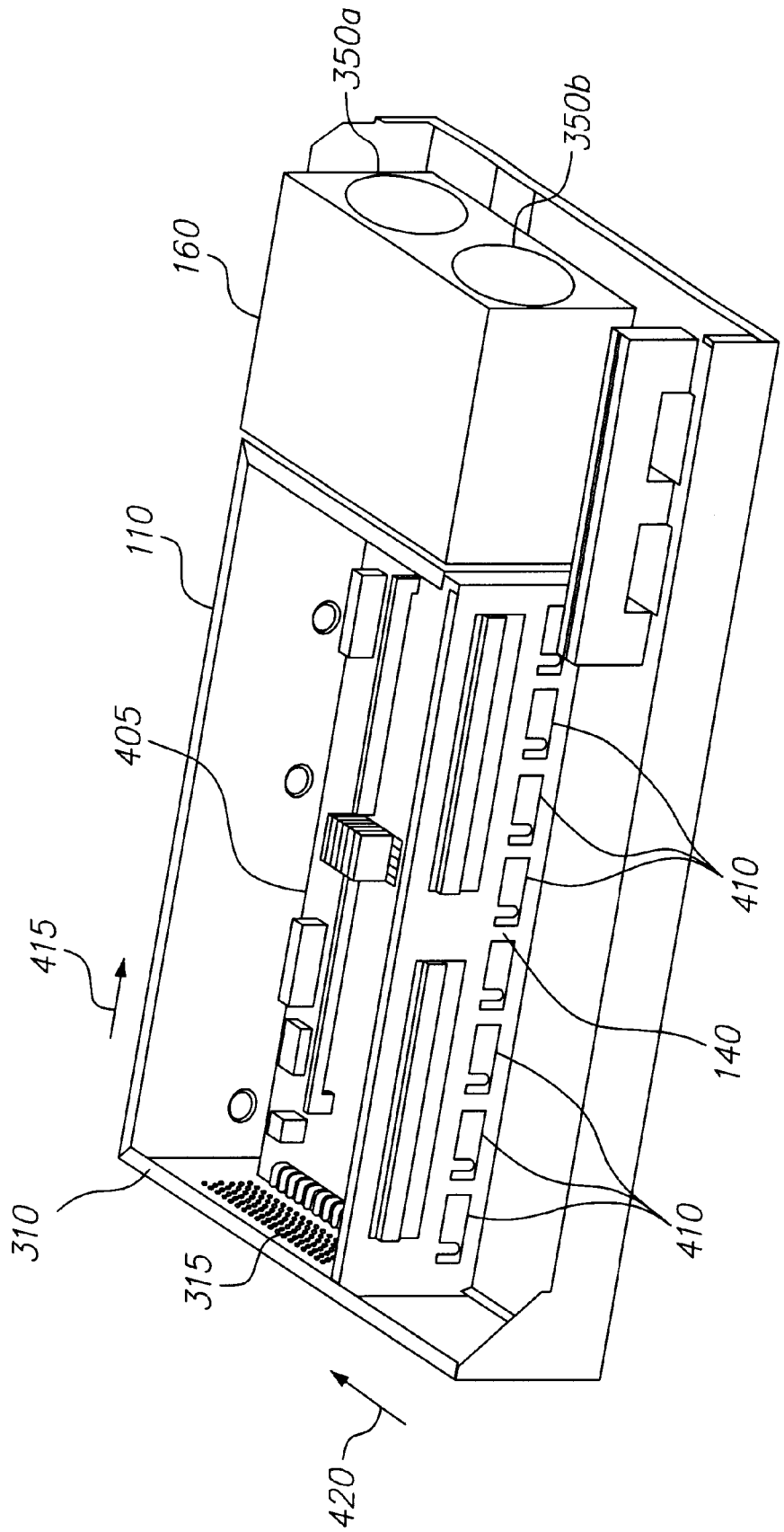
Figure 11C:
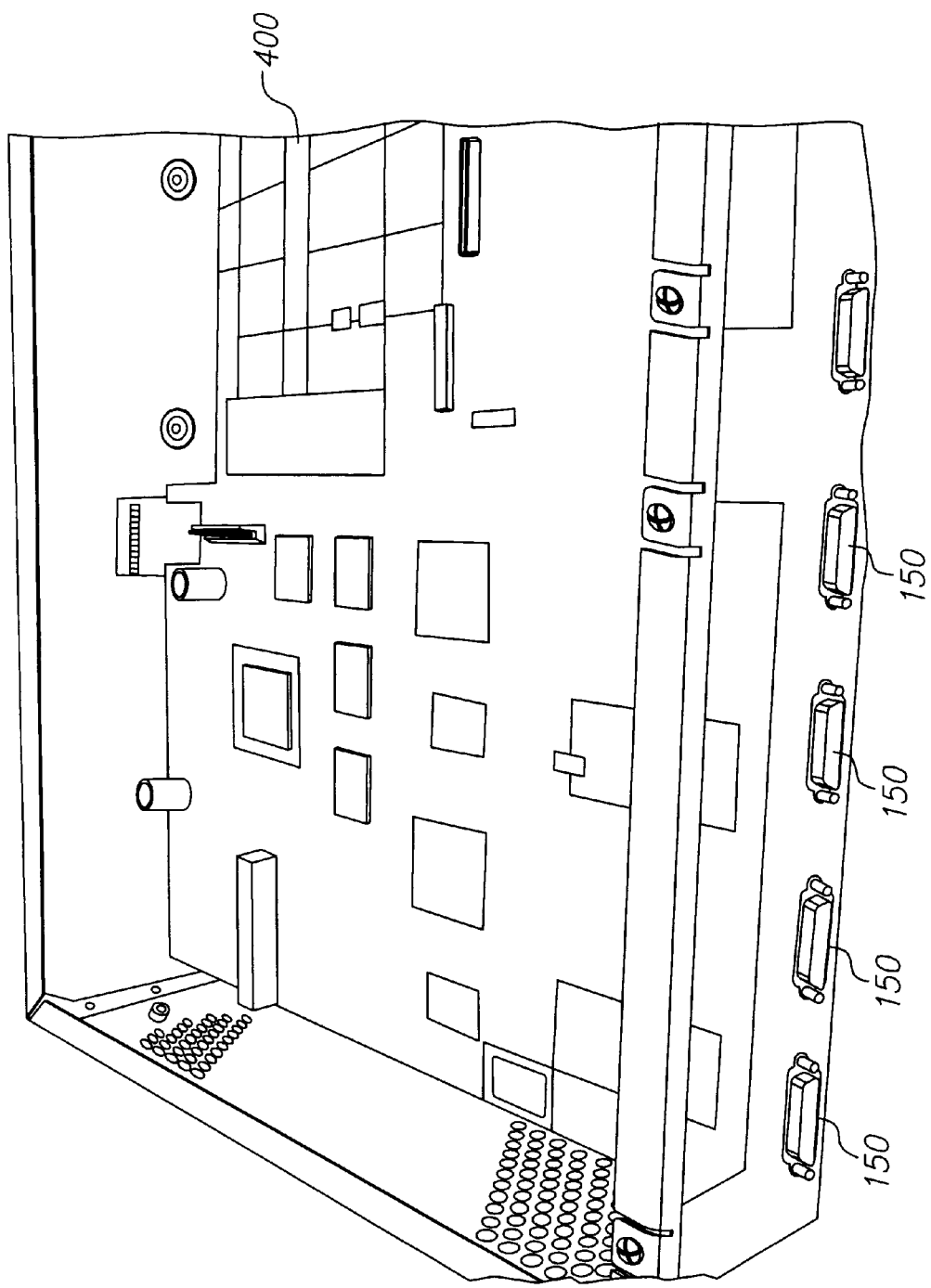
FIG. 11c is a top perspective view of a portion of the chassis assembly of FIG. 11a, wherein ports are supported by apertures in the chassis assembly bulkhead.

The chassis assembly 110 also includes an input/output (I/O) bulkhead 140 that permits cables to be supported and connected directly to a plurality of ports 150 (see FIG. 11c). The ports 150 are coupled to the printed wiring board (PWB) 400 (see FIG. 11c) that is within the chassis assembly 110. The bulkhead 140 includes apertures 410 (see FIG. 11a) in which the ports 150 are inserted. It is noted that the I/O bulkhead 140 may be located on either the left or right side of the chassis assembly.

A power supply 160 provides the required power source to the electronic assembly 100. The power supply 160 may be a modular unit that includes, or example, any of the following components: dual fans 350a/350b (FIG. 9) for cooling the electronic components inside the chassis assembly 110, an air baffle (not shown), an AC inlet, a power select switch, and a standard PC-type AC/DC power supply. Since the power supply 160 may be a self-contained modular unit, alternative power supply embodiments (e.g., higher voltage power supplies) may be implemented in the electronic assembly 100 without affecting the system design of the electronic assembly 100. It is noted that alternative power supply source embodiments may be added to the present invention due to the modular nature of the power supply source.

Figure 2B:
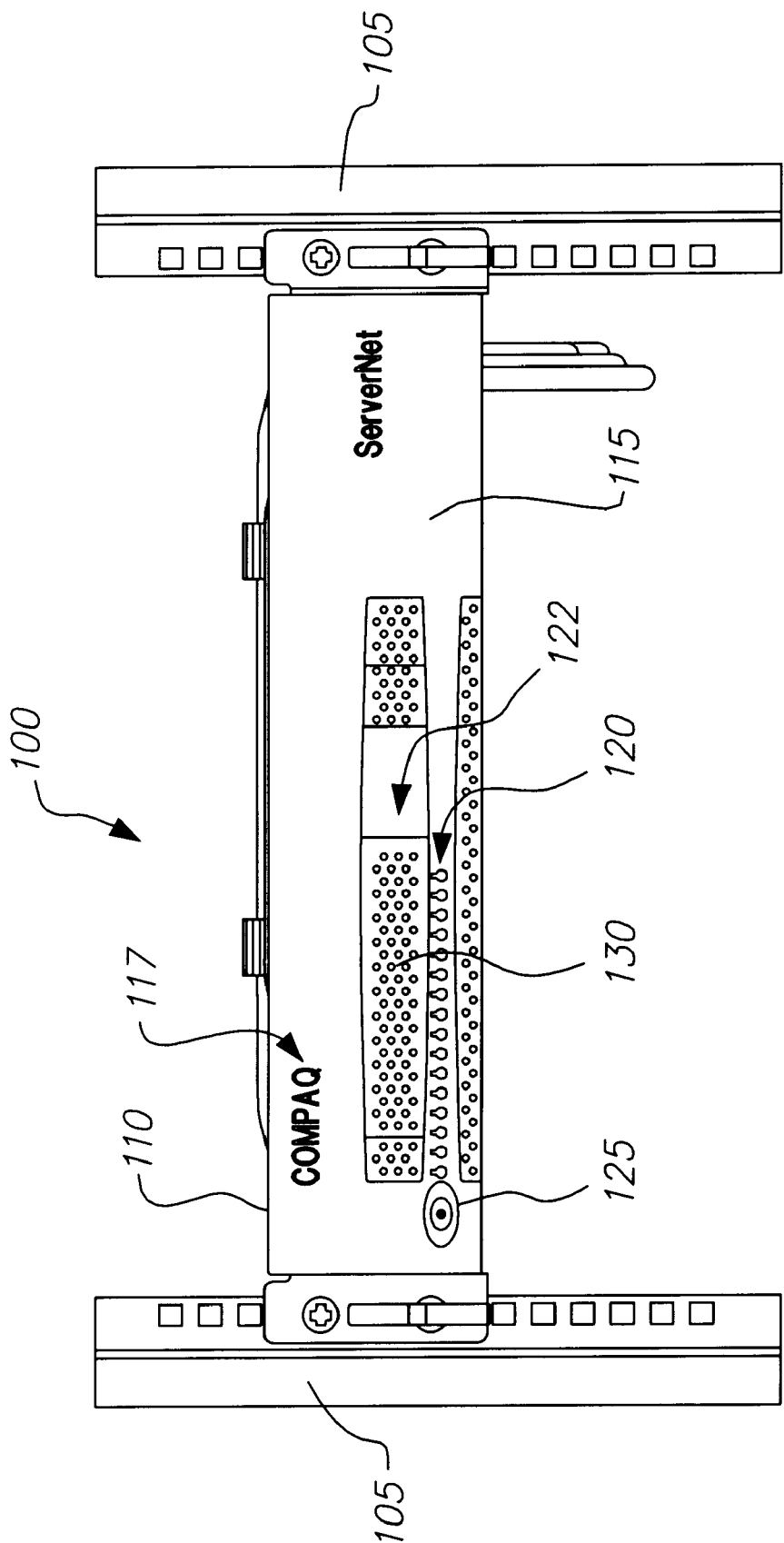
Figure 2C:
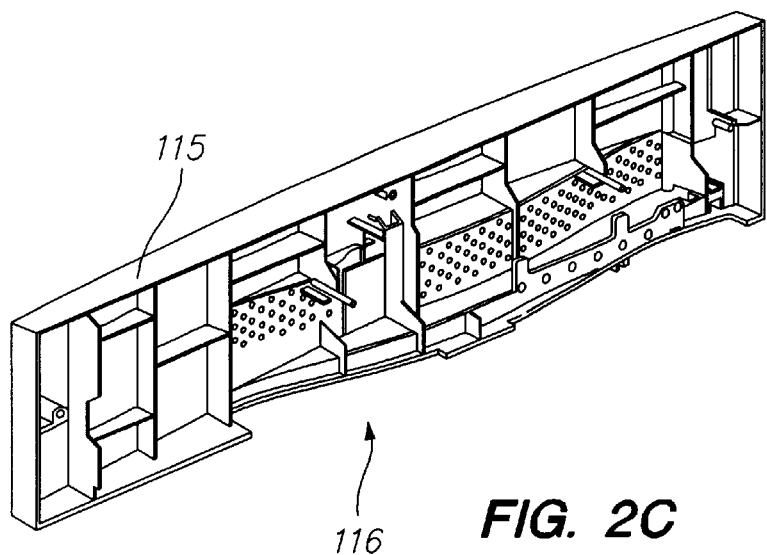

FIG. 2b is a front view of the electronic assembly 100. The front panel (or bezel) 115 is shown in additional details. The front panel 115 is, for example, a plastic material that is configured to match and is removably coupled to the front surface of the chassis assembly 110. The front panel 115 is preferably a plastic injection molded assembly that snap-fits onto the front portion of the chassis assembly 110. The front panel 115 may be easily re-configured within the manufacturing process and for re-sellers. The front panel 115 may incorporate any of the following features: corporate identity carrier 117, LED display 120, configurable serial number display 122, acoustic abatement, power (on/off) button 125, airflow apertures 130, and air flow control and routing provided by apertures 130.

Figure 3:
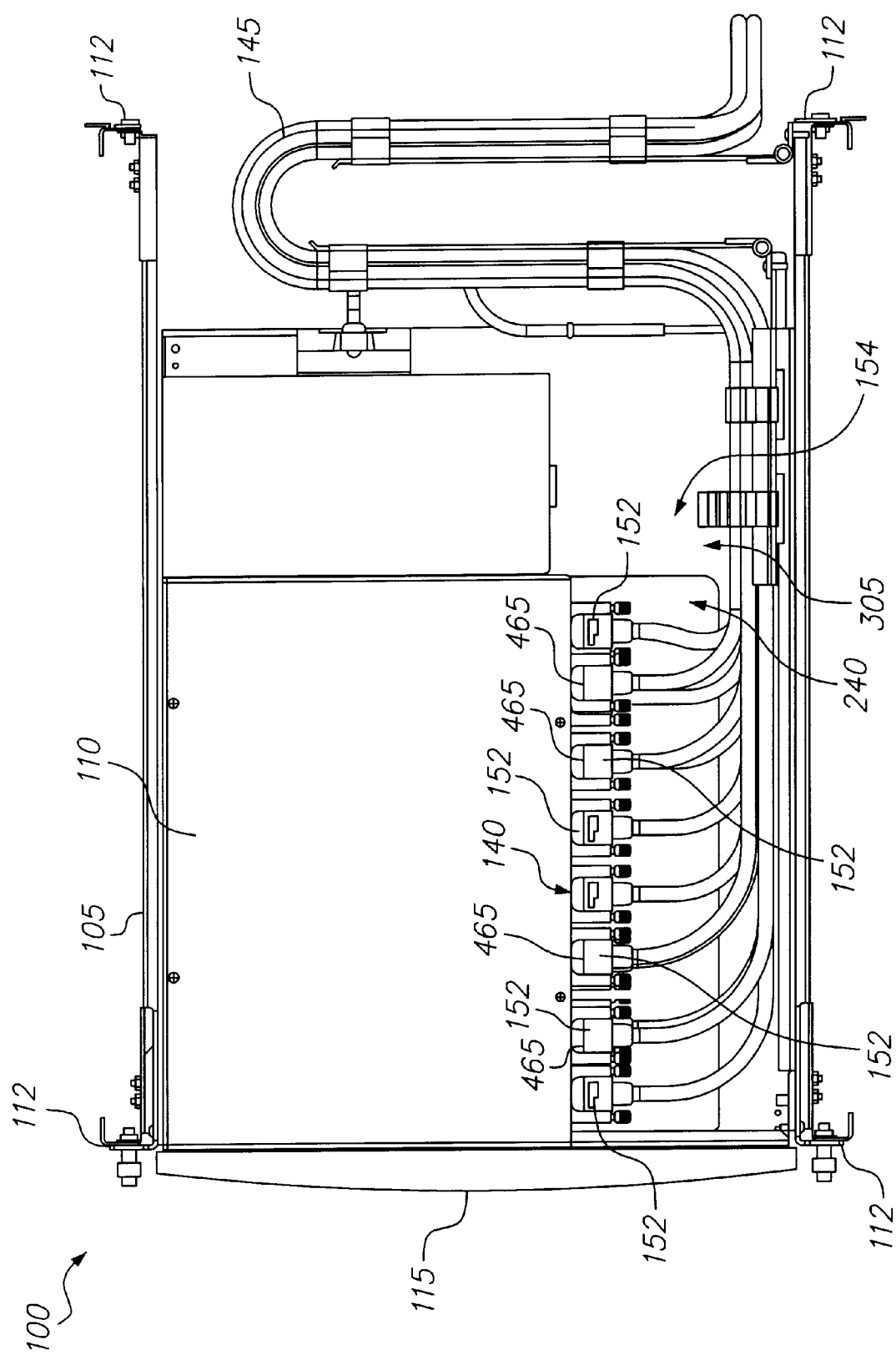

FIG. 3 is a top view of the electronic assembly 100. The I/O bulkhead 140 and the chassis base 305 define a sufficient cable path 154 that controls the bend radius for the cables 145. For cables 145, Velcro closures 367 (FIG. 2a) integrated into the chassis assembly control the cable routing and provide strain relief to the cables. As also described further below, the chassis base 305 provides an opening 240 that permits an ease of access to the ports 150 so that each connector 152 of a cable 145 is easily connected to or disconnected from a port 150. The ports 150, ports 465, and cables 145 can be easily accessed via opening 240 from an upward or downward direction.

Figure 4:
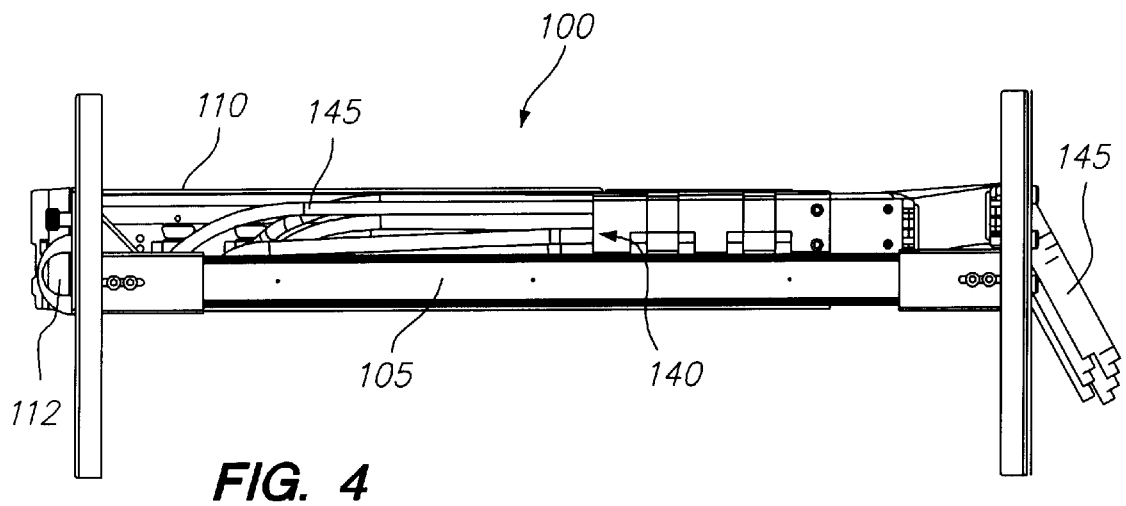
FIG. 4 is a right side view of the rack-mounted electronic assembly of FIG. 2a, as seen from the bulkhead side of the electronic assembly.
Figure 5:
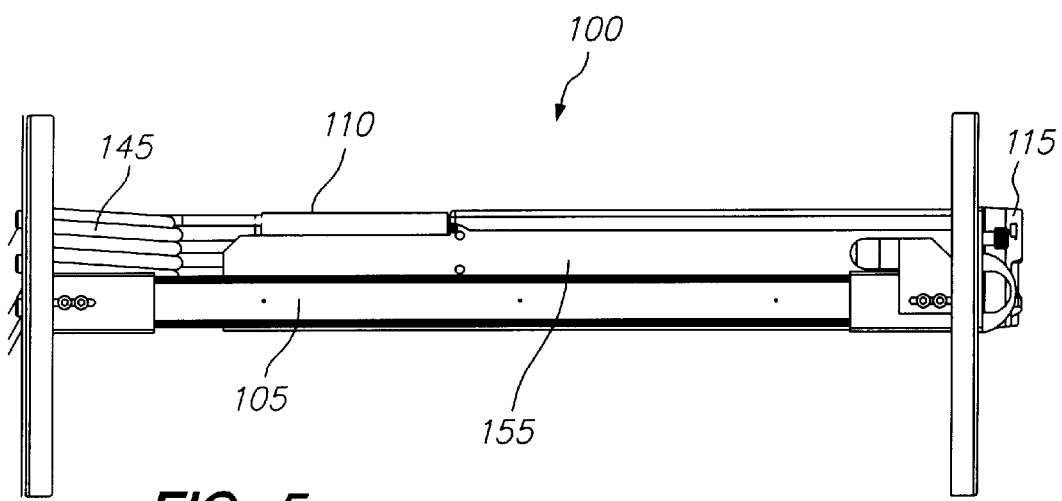
FIG. 5 is a side view of the rack-mounted electronic assembly of FIG. 2a, as seen from a side opposite to the bulkhead side of the electronic assembly.
Figure 6:
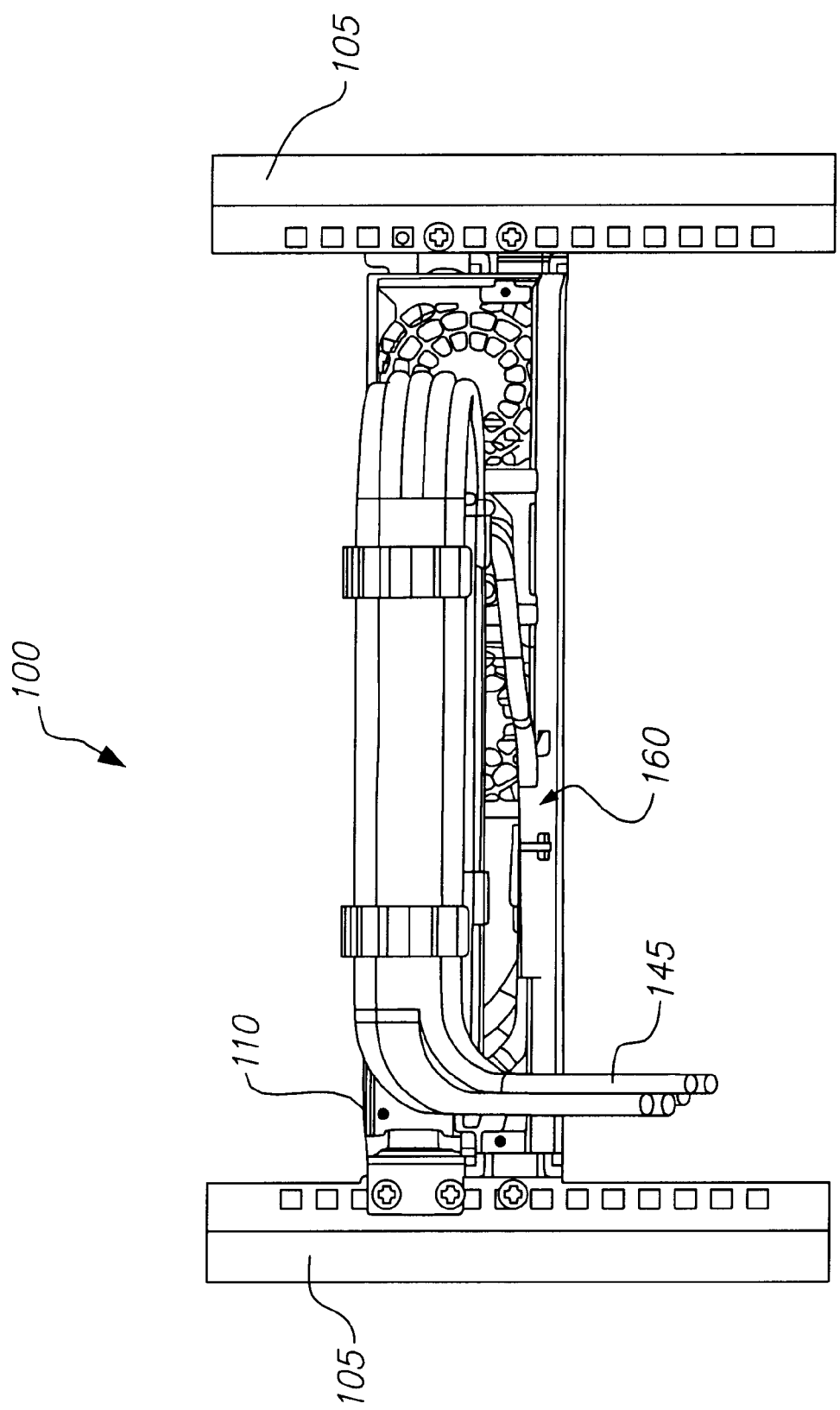

FIG. 4 is a side view of the electronic assembly 100, as seen from the I/O bulkhead 140 side. FIG. 5 is a side view of the electronic assembly 100 as seen from the left side 155 (see also FIG. 2a) of the chassis assembly 110. FIG. 6 is a side view of the electronic assembly 100, as seen from the rear side (power supply 160 side) of the chassis assembly 110.

Figure 7A:
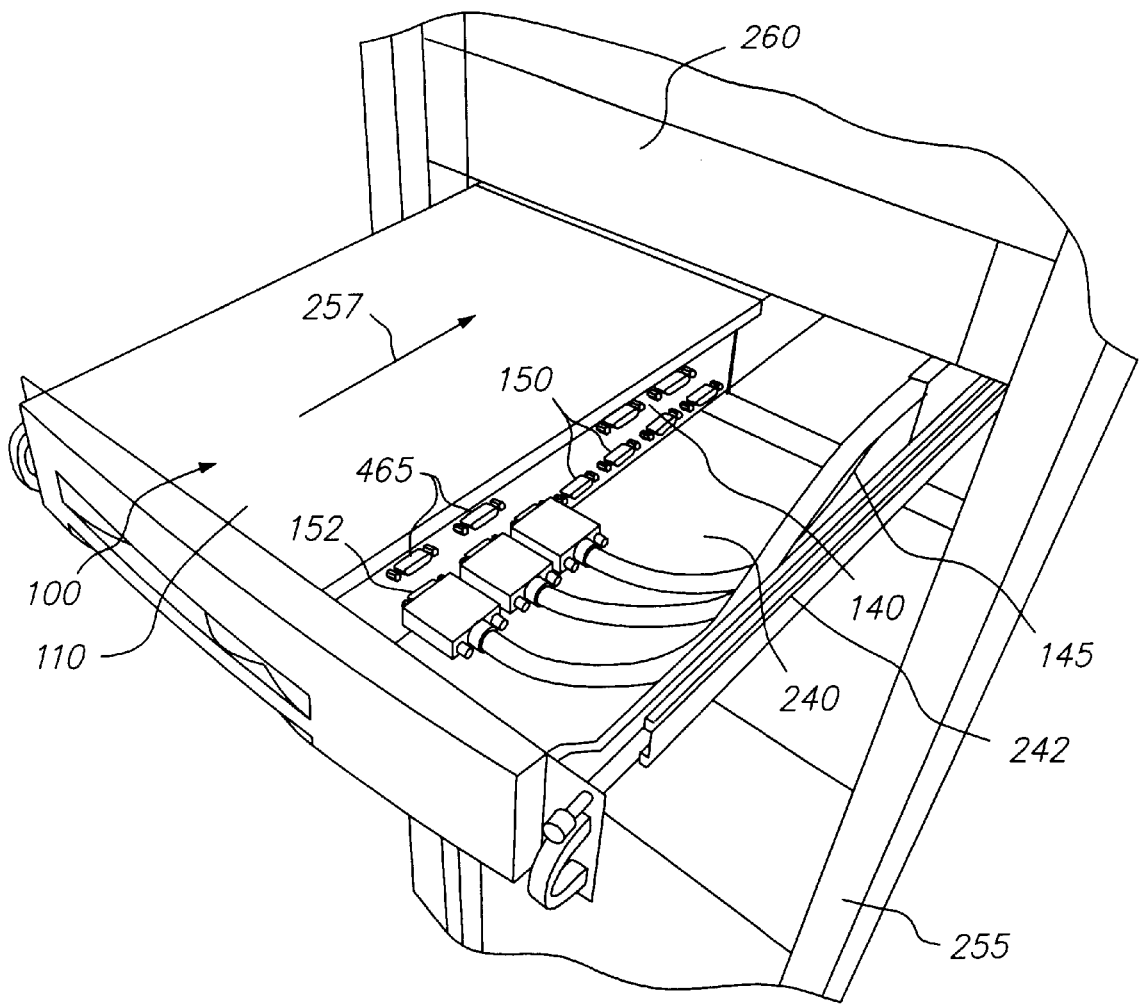
FIG. 7a is a top perspective view of the electronic assembly of FIG. 2a wherein the electronic assembly is mounted in a 19" rack with extendible slides.
Figure 7B:
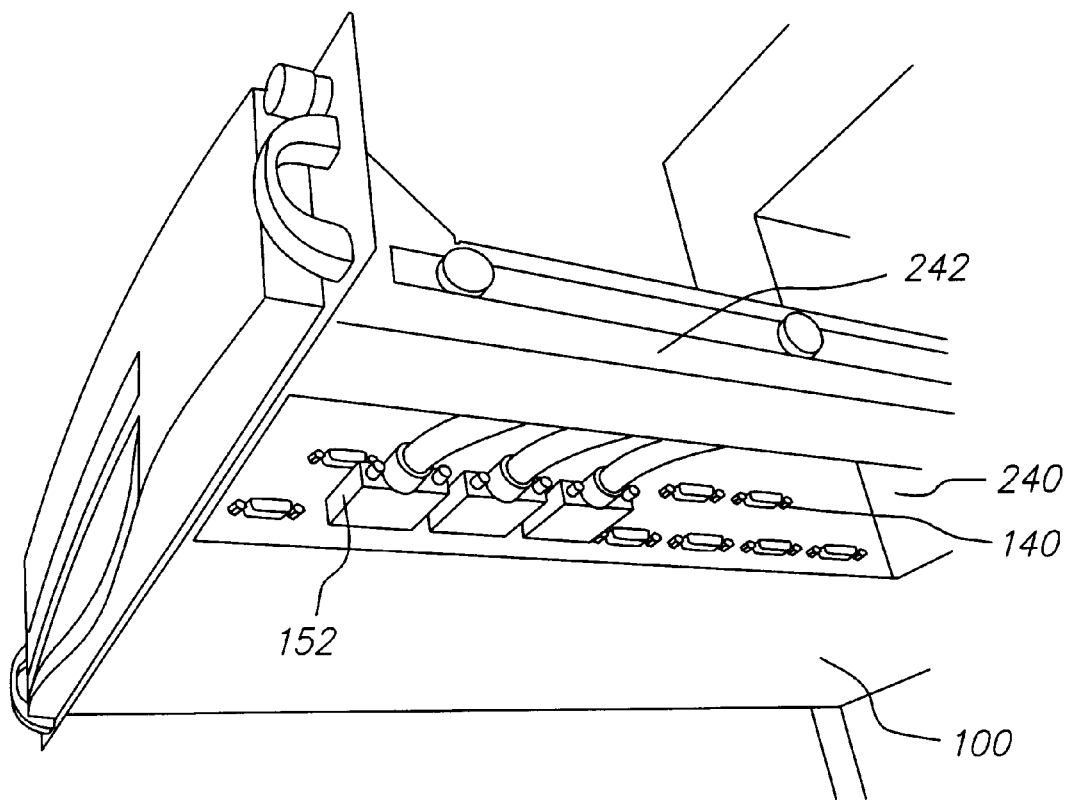
Figure 7C:
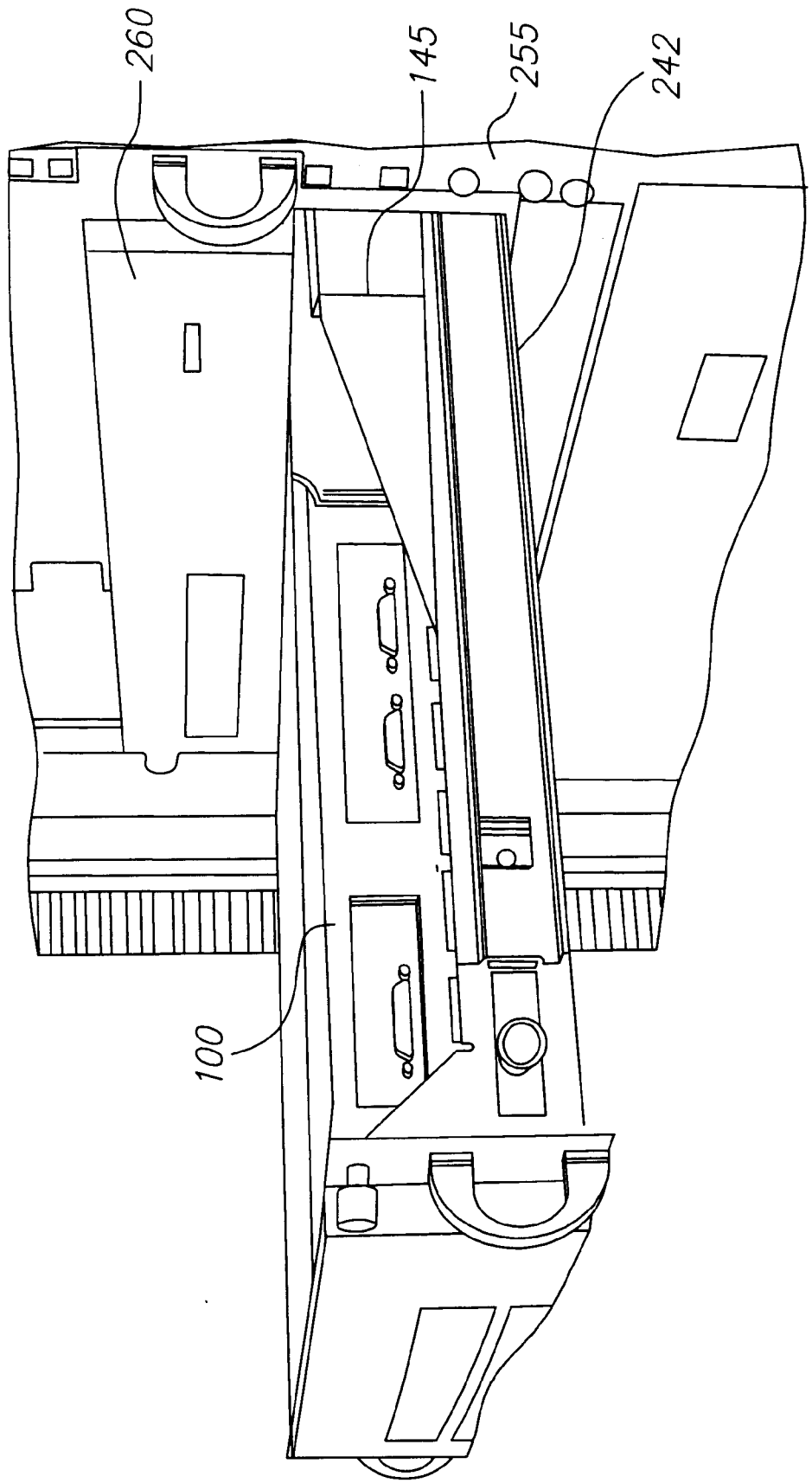

Reference is now made to various perspective views of the electronic assembly 100 as seen in FIGS. 7a–7c. The I/O bulkhead 140 and opening 240 permit the ports 150 to be easily accessible from above and below. As a result, the present invention provides an electronic assembly in which connectors 152 of cables 145 may be easily installed and serviced. The ease of access for serviceability made possible by the present invention can lead to less difficulty and less cost for the user, as well as mitigating the possibility of damage due to mis-insertion and down-time due to incorrect installation.

It is further noted that the FIGS. 7a–7c show the electronic assembly 100 in a drawn-out position along a slidable rack 242 of the system 255 so that the cables 145 and especially the cable connectors 152 are easily accessible by hand.

Therefore, by placing the ports 150 and 465 in the bulkhead 140 in the prescribed position of the present invention, the ports can be easily accessed for cable connection or removal, particularly if the chassis assembly 110 is mounted on a slidable rack.

During unit operation or after cable installation is completed, the electronic assembly 100 may be pushed into the system 255 housing, in a direction represented by arrow 257 (FIG. 7a), so that the cables 145 are not exposed and the electronic assembly 100 is substantially contained within the system 255. FIGS. 7a and 7c illustrate an electronic assembly 260 which is pushed into the system 255 housing.

In contrast, conventional electronic assemblies do not permit an ease of access for serviceability. In particular, in conventional electronic assemblies, the ports are normally located on the rear panel of the chassis. These ports are difficult to access for cable connection or disconnection, particularly when the conventional electronic assembly is mounted on a standard rack and the rack is, typically, placed against a wall. Additionally, since the conventional electronic assembly may not extend the full depth of the rack, the rear panel of the assembly may also be difficult to reach from the rear of the rack. Therefore, the ports are almost unreachable to the user due to the physical constraints to accessibility created by the rack.

FIGS. 7a and 7b also illustrate a further advantage provided by the present invention. The bulkhead 140 can support, for example, at least twelve (12) ports (i.e., daughter-card ports 150 and 465). The increased number of ports permit greater switching capability and function for an electronic assembly that implements the present invention. It is further noted that the advantages provided by the present invention (including increased number of ports, improved serviceability, improved airflow from the chassis side panel) are achieved partly due to the chassis assembly configuration, which provides a chassis assembly 110 with a length measurement greater that its width measurement. The improved airflow advantage made possible by the present invention is described further below.

Method of Assembly

Figure 8A:
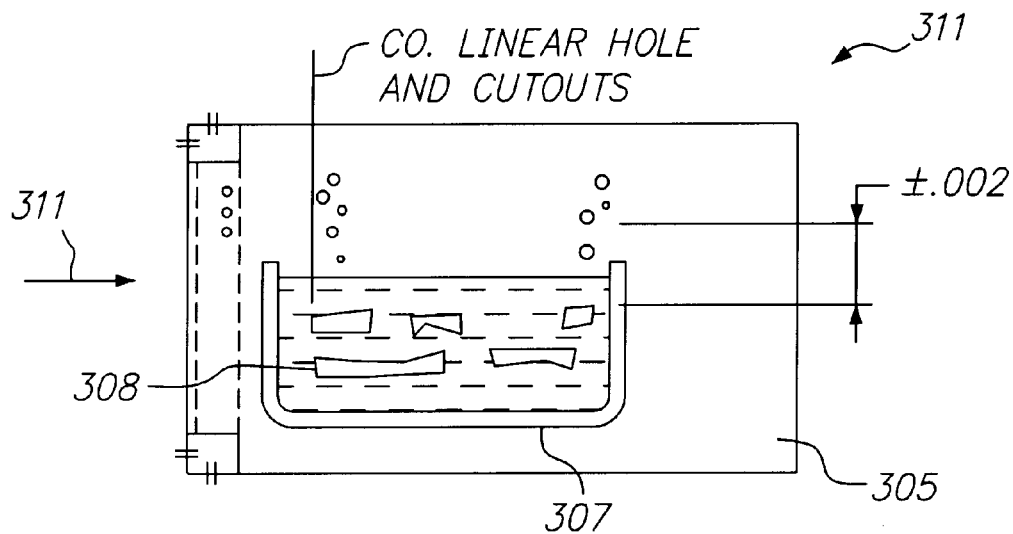
FIG. 8a is a top view of a flat pattern sheet metal blank for forming a base of a chassis assembly in accordance with an embodiment of the present invention.

The following drawings describe the assembly and construction of the components and parts in the electronic assembly 100. Referring first to FIG. 8a, there is shown a top view of a steel sheet that forms chassis base 305. The chassis base 305 is cut along dashed lines 307 to define a portion 308.

Figure 8B:
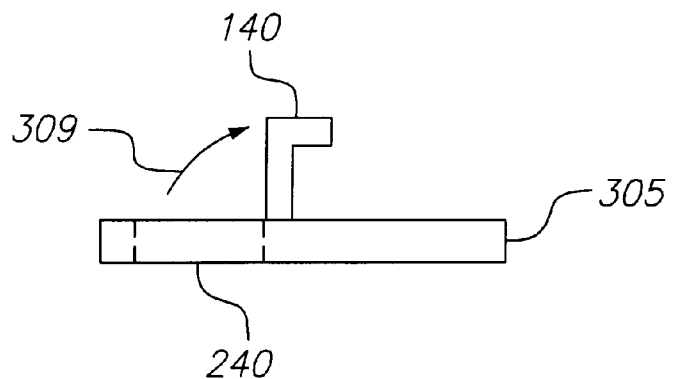
FIG. 8b is a front view of the sheet metal of FIG. 8a after formation of the bulkhead.
Figure 8C:
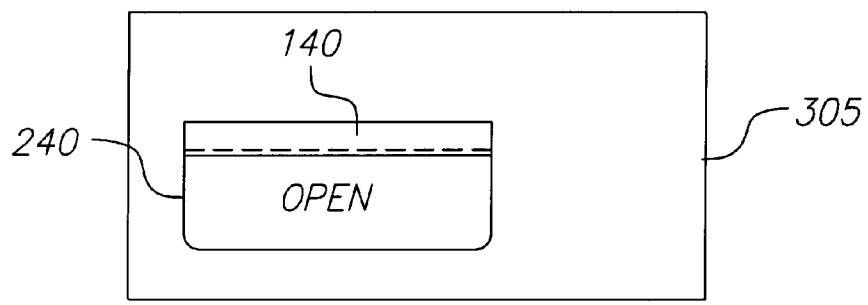
FIG. 8c is a top view of the chassis base after formation of the bulkhead and chassis base opening.

FIG. 8b shows the chassis base 305 as seen from the direction of arrow 311 in FIG. 8a. The portion 308 is bent in the direction of arrow 309 to form the I/O bulkhead 140 which is two perpendicular to the base 305. As best shown in FIG. 8c, by forming the bulkhead 140, the opening 240 is formed on the chassis base 305.

A manufacturing advantage is obtained since the bulkhead 140 is created from the same metal sheet as the chassis assembly 110. This fabrication technique provides (inherent to the process) dimensional accuracy for board mounting features located on both planes.

Figure 8D:
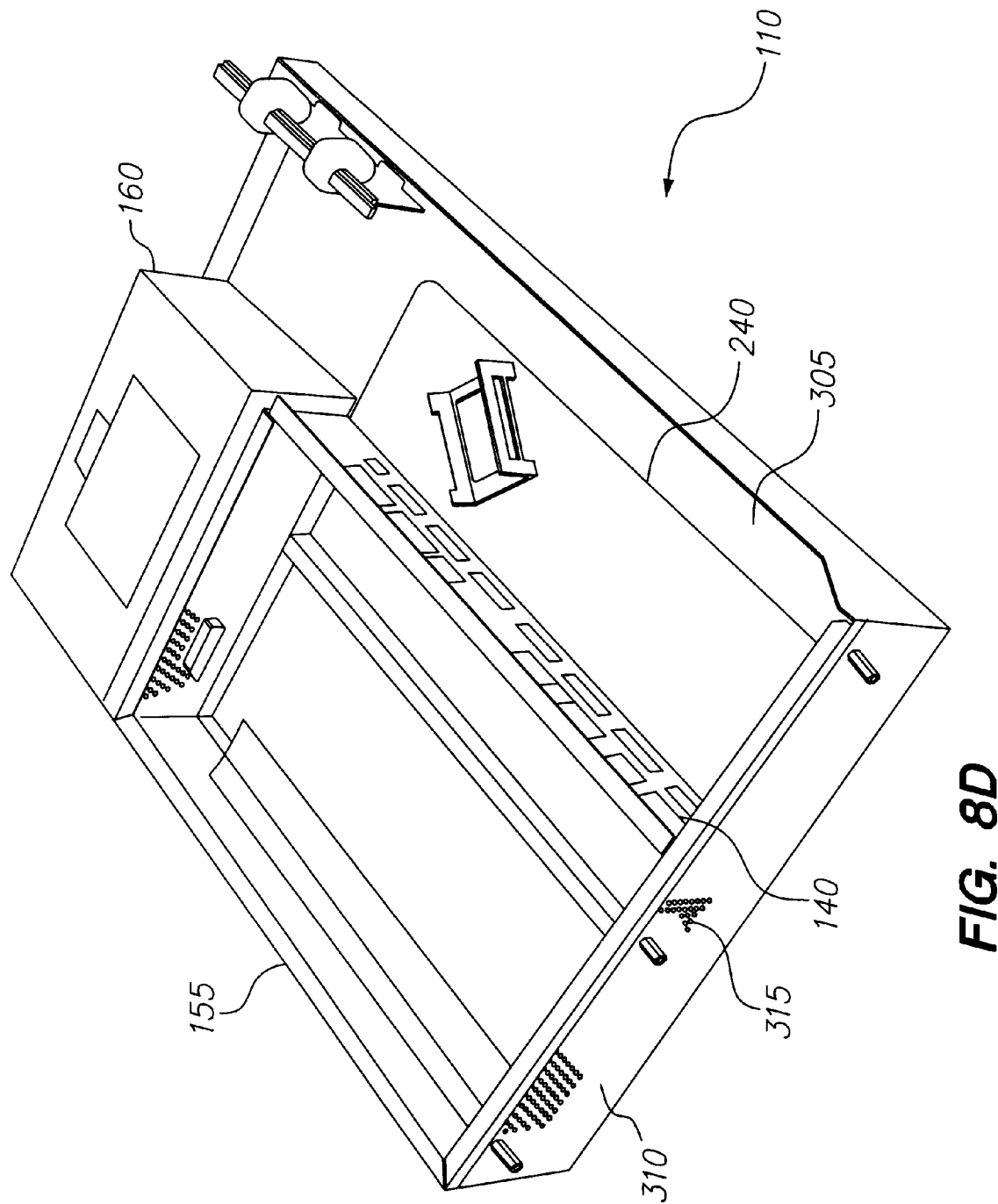
FIG. 8d is a top perspective view of a chassis assembly in accordance with an embodiment of the present invention.

FIG. 8d shows the chassis assembly 110 after the front panel 310 and side panel 155 are formed from the chassis base 305. In addition, the power supply 160 has been assembled on the chassis base 305. The chassis assembly 110 is shown without a printed wiring board (PWB).

The I/O bulkhead 140 and opening 240 permit an ease of serviceability for the present invention, as mentioned above. In addition, air intake apertures 461 (FIG. 12b) may be formed in the I/O bulkhead 140 to improve or increase air flow within the chassis assembly 110.

Figure 9:
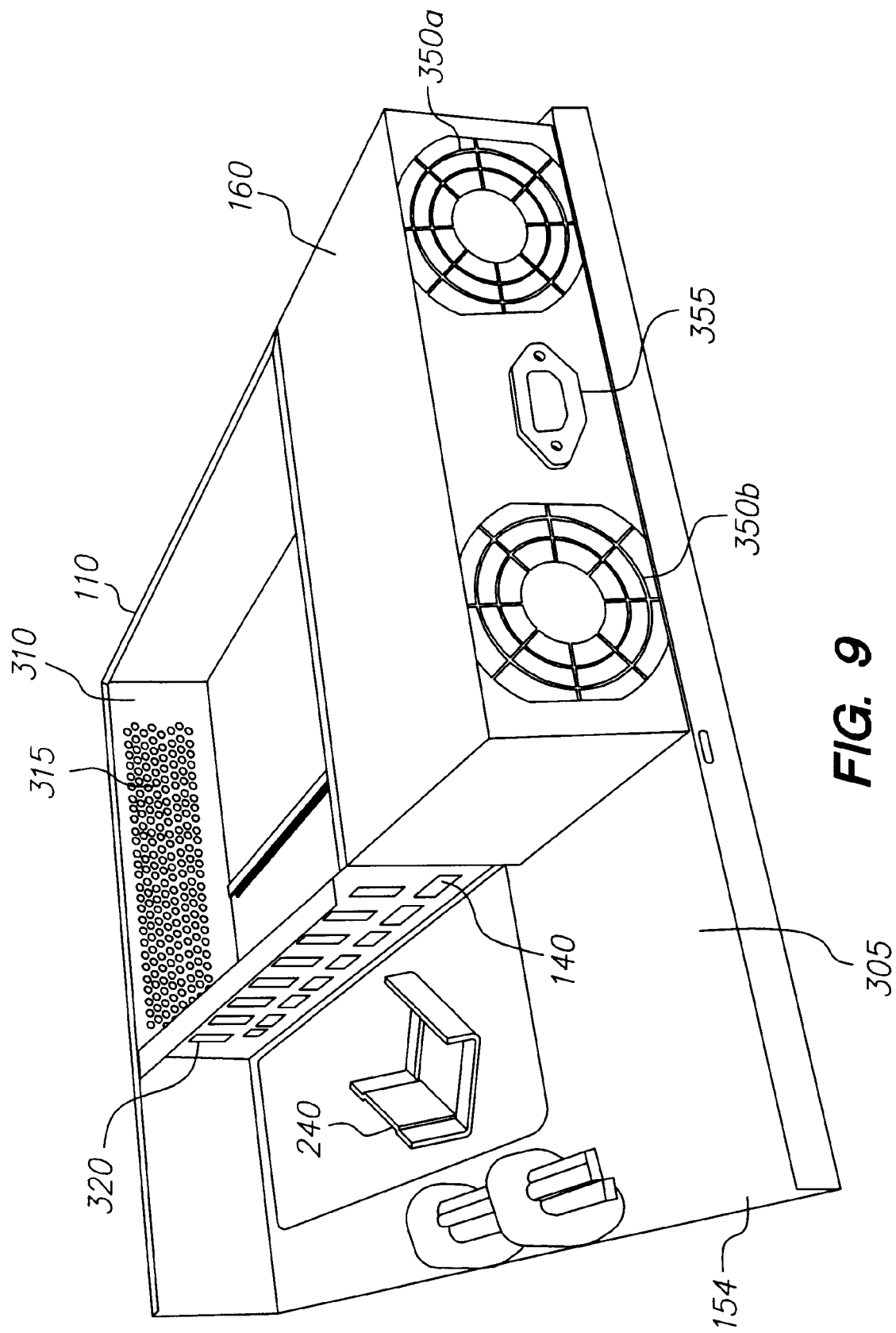

FIG. 9 shows the chassis assembly 110 as seen from the chassis rear panel with the power supply 160. The air fans 350a and 350b control the flow of air within the chassis assembly 110 and may be implemented by, for example, low cost air movers, such as muffin fans.

The chassis assembly 110 allows for air flow intake on the front chassis surface 310. The air flow is received through the apertures 130 of the front panel 115 (FIG. 2b) and then through the apertures 315 (FIG. 9) on the front chassis surface 310. The chassis assembly 110 also allows for air flow intake via apertures 461 (FIG. 12b) that may be formed in the I/O bulkhead 140. The air flow intake at the side I/O bulkhead 140 is possible, since the I/O bulkhead is recessed from any 19" rack wall. The air flow is then received in the chassis assembly 110. The dual planar surface air intake capability of the present invention presents a key advantage over conventional approaches.

The chassis assembly 110 may also provide the following functions or purpose in the electronic assembly 100:

(1) The chassis assembly 110 creates an electromagnetic interference (EMI)- tight box that forms the enclosure for the printed wiring assembly (PWA) used in the electronic assembly.

(2) The chassis assembly 110 may be provided with apertures to improve air flow within the chassis assembly.

(3) The chassis assembly 110 may be implemented in a structure that interfaces with standard EIA 19" racks and that provides mounting for extension slides and retention features (element 112 in FIG. 3 or 4).

(4) The chassis assembly 110 provides a structure that provides mounting for a removable and configurable plastic front panel or bezel 115 (FIGS. 2a and 2b).

(5) The chassis assembly 110 may provide for an air plenum (generally shown in FIG. 3) and an I/O cable egress raceway near opening 240 in FIG. 9.

(6) The chassis assembly 110 provides the raceway 154 (FIG. 9) which controls the I/O cable bend radius insuring a minimum radius is not violated and provides for cable retention.

Figure 10:
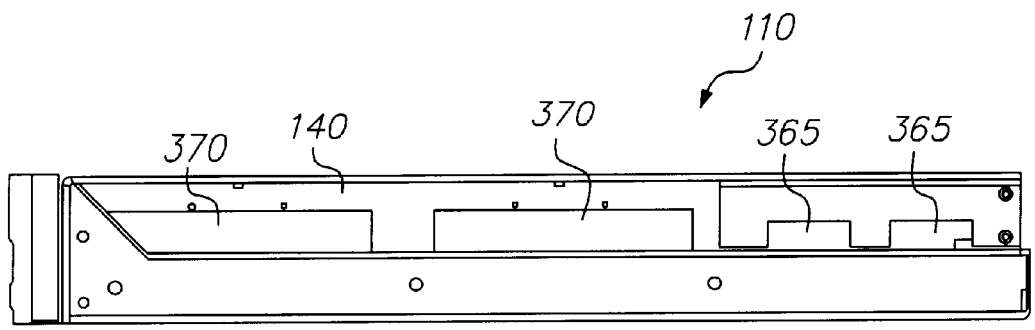

FIG. 10 is a side view of the chassis assembly 110 as seen from the bulkhead 140 side. The apertures 370 provide openings that support daughter-card ports, as described below, while apertures 365 may be used for insertion of cable retention elements 367 such as Velcro closures (FIG. 2a) to provide cable retention and support for strain relief.

FIGS. 11a–11d are various views of the chassis assembly 110 after a motherboard (PWB) 400 is installed in the chassis assembly. The motherboard 400 is the central electrical component in the electronic assembly 100, and may provide all internal interconnects for the electronic assembly by designing the motherboard such that it spans the front-to-back length of the interior of chassis box portion 405 of the chassis assembly 110, thus eliminating the need for internal cabling, so as to achieve lower cost and assembly time. The motherboard 400 may, for example, support a router Application Specific Integrated Circuit (ASIC) 410 for use in network switching functions requiring an increased number of I/O ports. In addition, the motherboard 400 may support the following exterior interfaces: (1) the status LEDs 120 and the power on/off switch 125 on the front panel 115; (2) ports 150 and ports 465 through the I/O bulkhead 140; and (3) the rear panel of the chassis assembly 110 where a blind-pluggable power connector 355 (FIG. 9) is provided to accept DC voltage from a system power supply.

As also shown in FIGS. 11a and 11b, apertures 410 are formed in the I/O bulkhead 140. These apertures 410 provides openings for the ports 150. Air flow is received through apertures 130 on the front panel 115 (FIG. 11a) and through apertures 315 on chassis front portion 310 (FIG. 11b). Air will have a straight flow direction as shown by arrow 415 towards fans 350a and 350b, thereby providing an efficient method to cool the components on the motherboard and daughter-cards in the chassis box portion 405 as air can also flow between the parallel planes of the motherboard and daughter cards. Additionally, air flow in the direction of arrow 420 may enter into the chassis box portion 405 via airflow apertures 461 (FIG. 12b)) that may be formed in the bulkhead 140 which is a key feature to enable the cooling of thermally-sensitive I/O components such as Gigabit Interface Converters (GBICs).

FIG. 11c is a top perspective view of a portion of the chassis assembly 110. The ports 150 are shown as being inserted through apertures in the bulkhead 140.

FIG. 11d is a top view of the chassis assembly 110. The motherboard 400 in the chassis box portion 405 supports numerous electronic components including router ASIC 410.

Figure 12A:
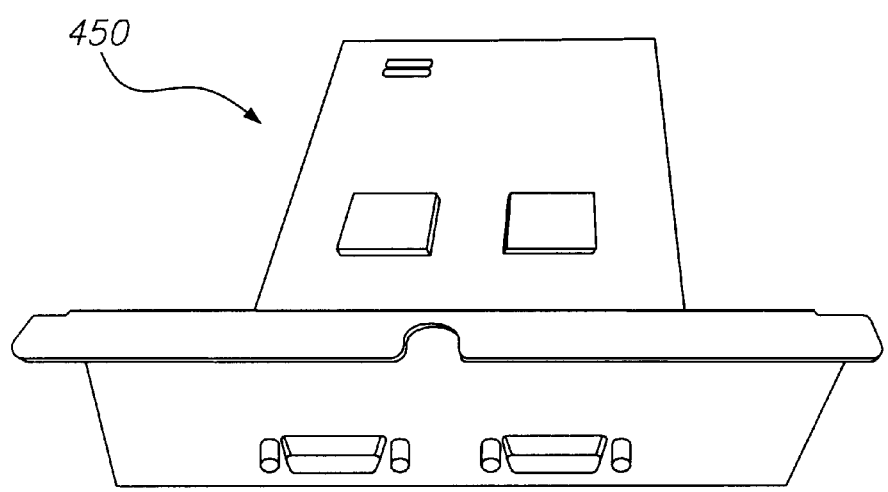
FIG. 12a is a top perspective view of a double-wide daughter-card that may be contained in an electronic assembly in accordance with an embodiment of the present invention.
Figure 12B:
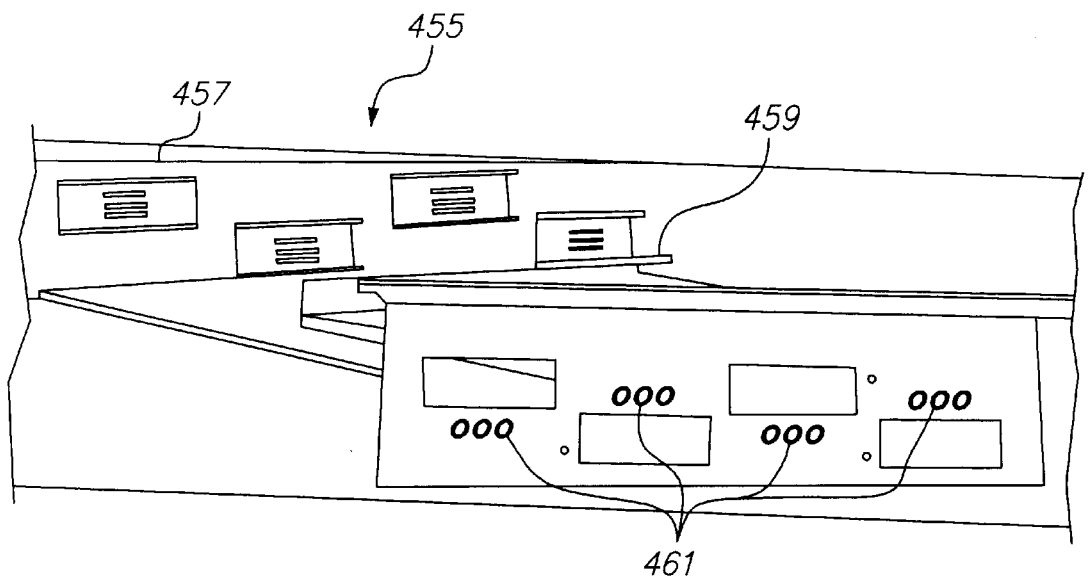
FIG. 12b is a side view of a portion of a dual daughter card that may be contained in an electronic assembly in accordance with an embodiment of the present invention.

The motherboard 400 may also support various types of daughter-cards, thereby allowing for a wide range of PWB surface areas in a removable modular arrangement. Three basic form-factor daughter-card types may be mounted on the motherboard 400: single daughter-cards, double-wide daughter-cards, and dual daughter-cards. FIG. 12a is a top perspective view of a double wide daughter-card 450 that may be supported by the motherboard 400. FIG. 12b is a side view of a dual daughter-card 455 which is formed by two double-wide daughter-cards that are mounted together in a mezzanine arrangement. FIG. 12b illustrates this mezzanine arrangement in which a double-wide daughter card 457 is shifted left in position above a double-wide daughter card 459.

All daughter-cards may be designed to interconnect to the motherboard 400 in a mezzanine configuration. The single daughter-cards (not shown) are equipped with faceplates that enable an electromagnetic interference (EMI)-proof fit to the internal surface of the bulkhead 140 and that serve to prevent flexing at the bulkhead 140 surface by heavy and/or unyielding I/O cables 145 that couple to the bulkhead. In one embodiment, double-wide and dual daughter-cards utilize mezzanine connectors that are sized so that a maximum of three levels of PWBs are attained within the chassis assembly 110 enclosure (i.e., chassis box portion 405 in FIG. 11b), yielding a total of, for example, over 440,000 square millimeters of daughter-card surface area.

Figure 13A:
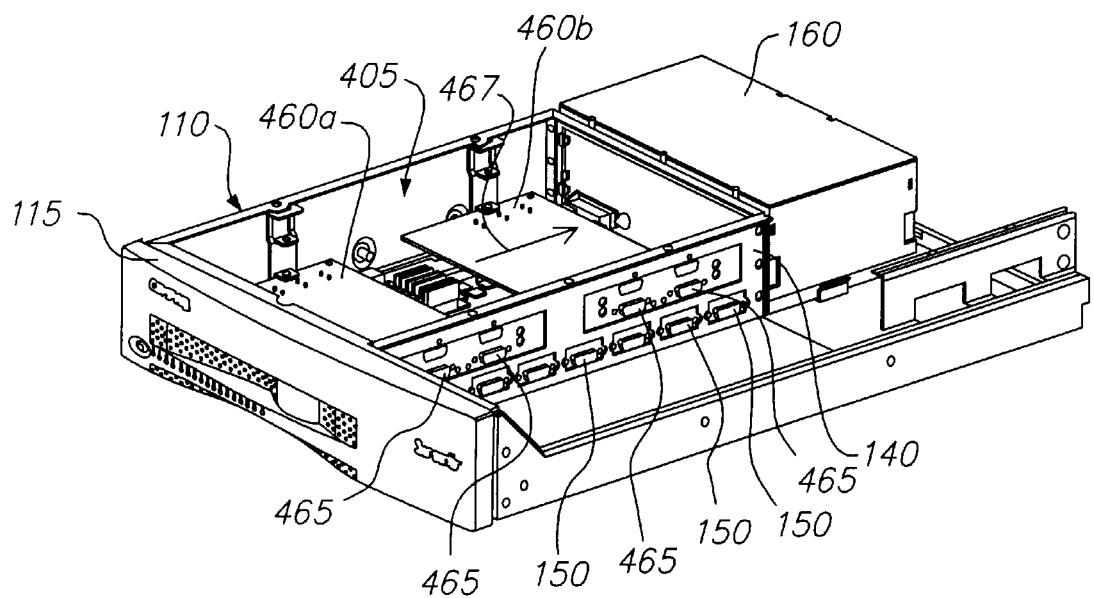
FIG. 13a is a side perspective view of a chassis assembly in accordance with an embodiment of the present invention, wherein a pair of daughter-cards are mounted on a motherboard in the chassis assembly.
Figure 13B:
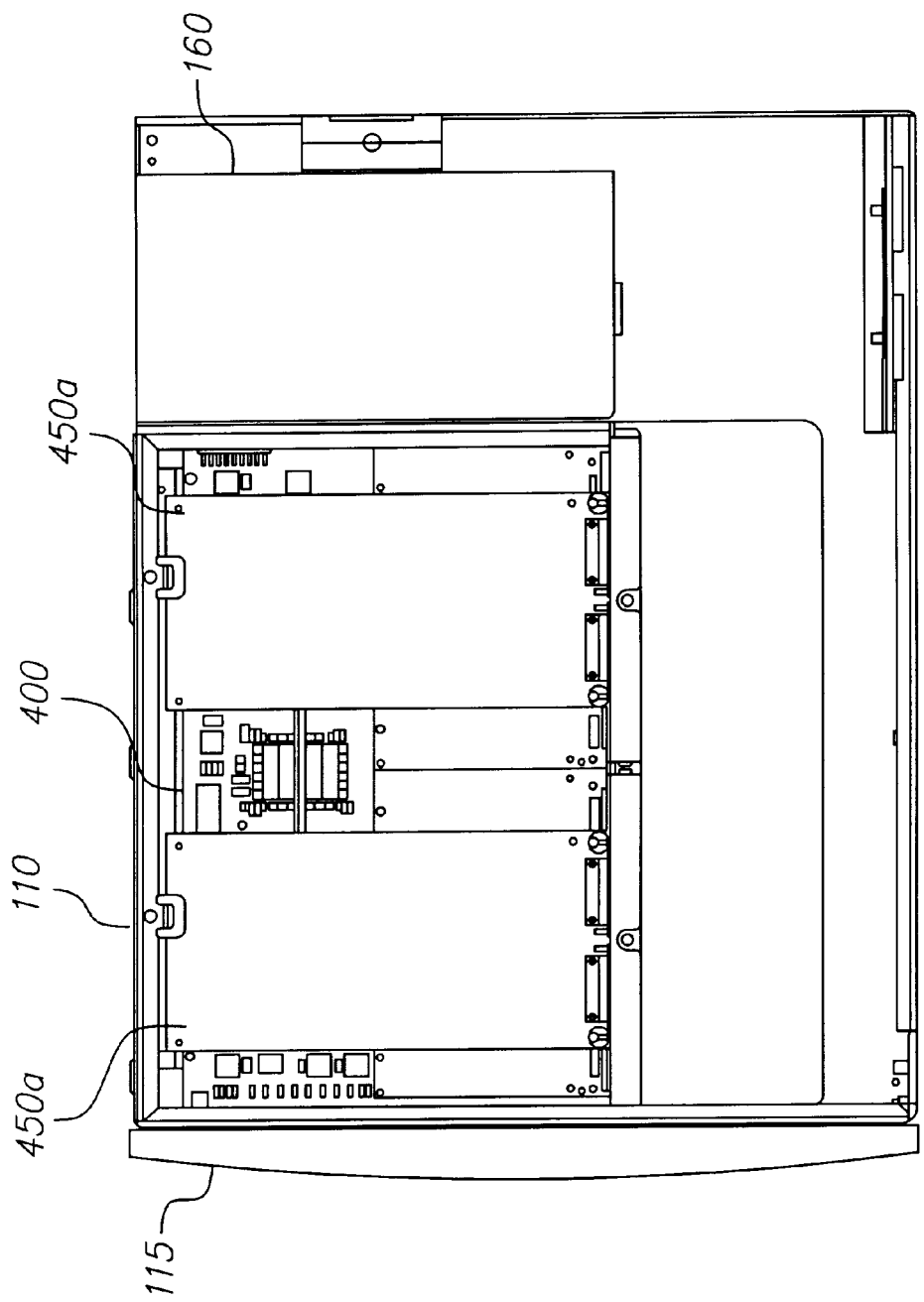
Figure 13C:
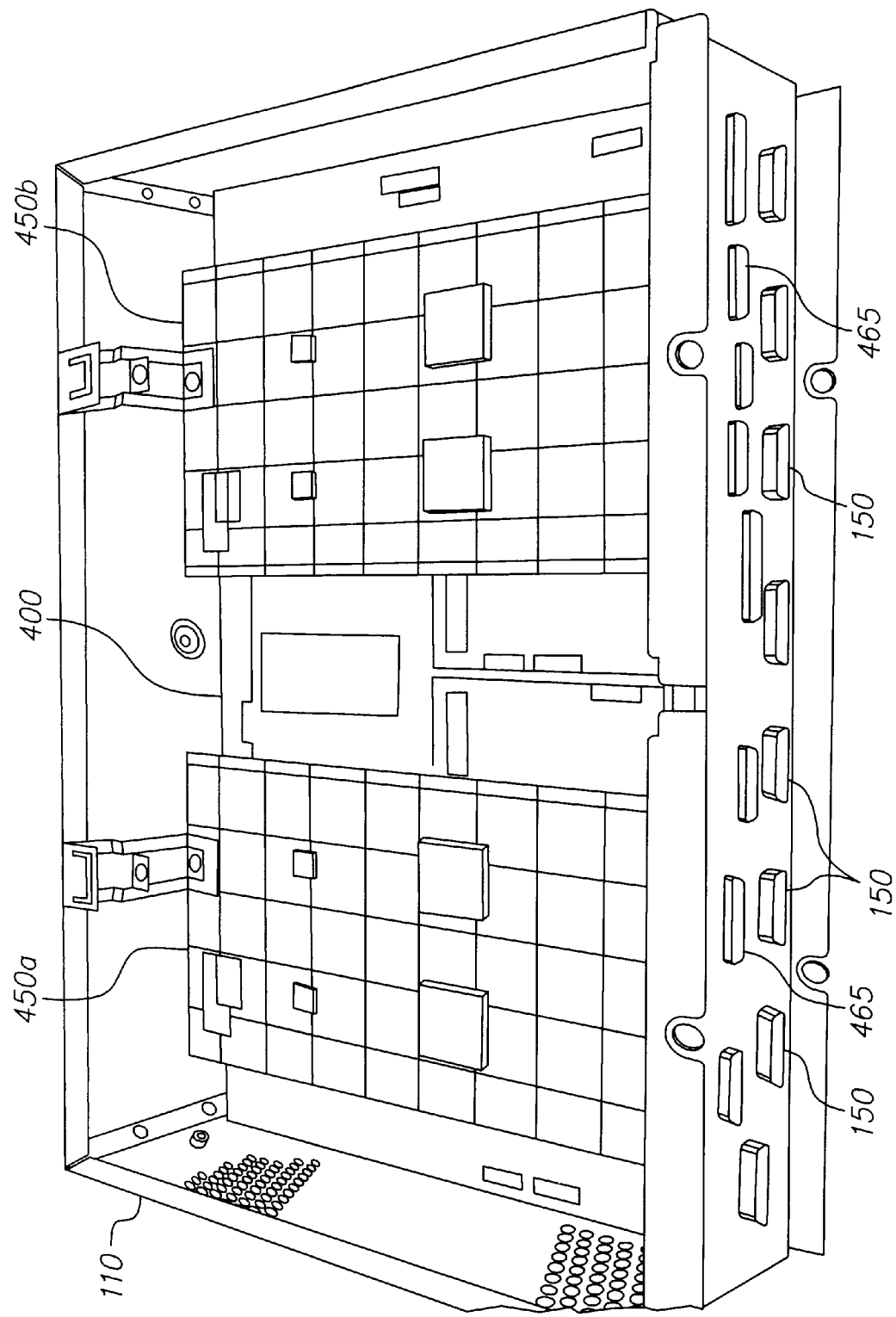
FIG. 13c is a top perspective view of the chassis assembly of FIG. 13a, wherein components and ports have been attached to the daughter-cards.

FIGS. 13a–13c show various views of a chassis assembly 110 including daughter-cards 460a and 460b mounted on the motherboard 400. Each daughter-card requires additional ports 465 that serve as external interfaces for the daughter-cards. Accordingly, additional apertures can be formed on the I/O bulkhead 140 for supporting the additional ports 465, since the chassis assembly length 110 is longer than its width.

The air flow direction in the chassis assembly is shown by arrow 467. This straight flow direction is possible since the ports 150 and 465 are located in the bulkhead 140 and, therefore, do not block the air flow. The "straight-through" optimized air flow configuration permits the use of low cost air movers in the electronic assembly and also eliminates the higher-pressure air flow requirement of conventional approaches.

Additionally, FIG. 13c shows the electronic components assembled on the daughter-cards 450a and 450b. The ports 150 associated with the motherboard 400 and the ports 465 associated with the daughter-cards total twelve (12) in number. Thus, the present invention can advantageously provide, for example, a 12-port switch (with up to ⅝ inch diameter cables required per port) that may be supported and mounted on a standard EIA 19" form-factor rack.

In contrast, a conventional electronic assembly contains ports that are located on the rear panel of the electronic assembly chassis. The 19" rack opening limits the size of an interface board in the conventional chassis and, therefore, limits the number of ports that may be supported by the conventional chassis, since it has a width which is less than its length (depth). Typically, no more than six (6) ports (with up to ⅝" diameter cables per port) may be supported by the conventional chassis across the width.

Figure 14A:
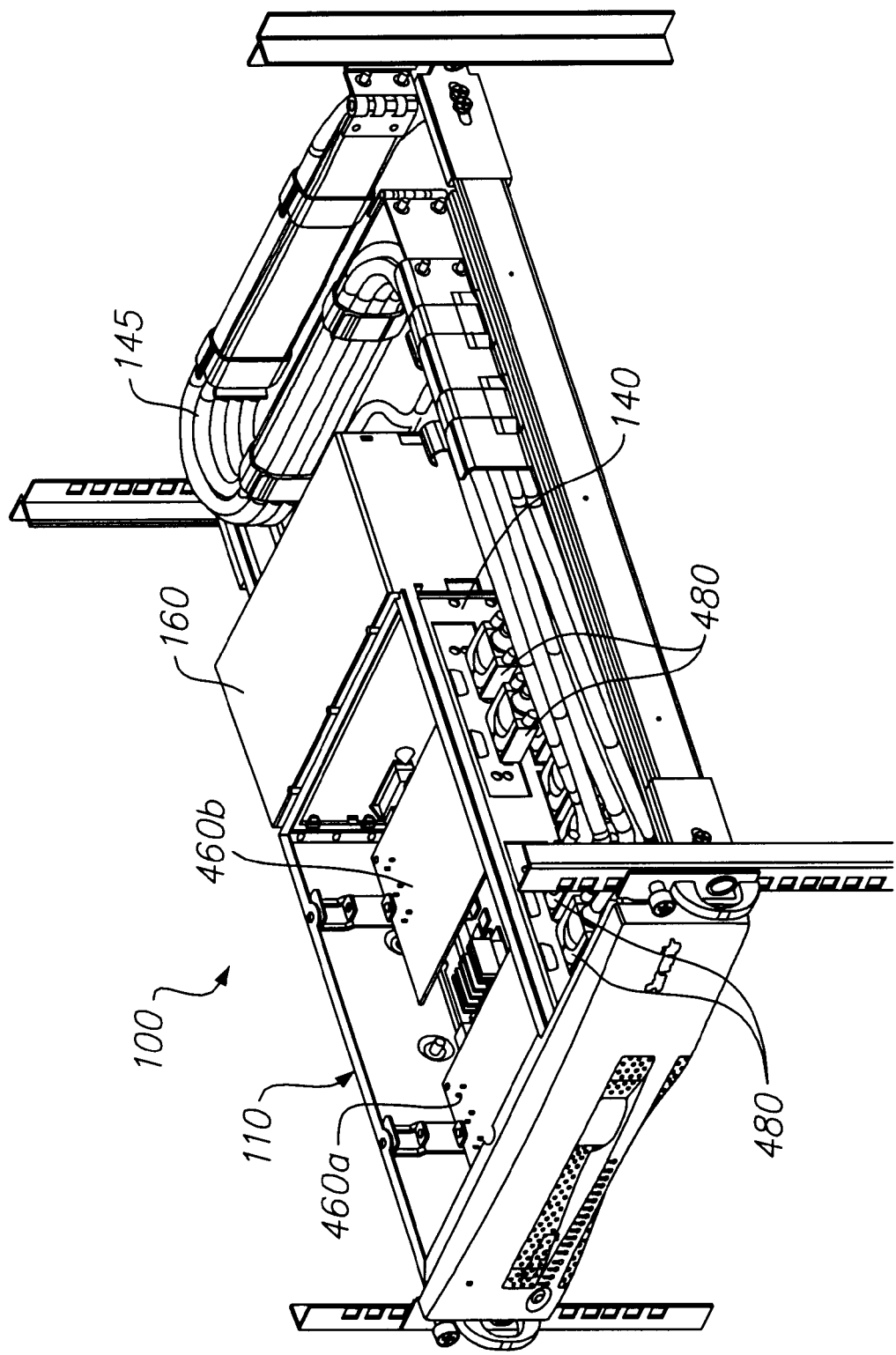
FIG. 14a is a side perspective view of the rack-mounted electronic assembly of FIG. 2a wherein the daughter-cards and cable connections are shown.
Figure 14B:
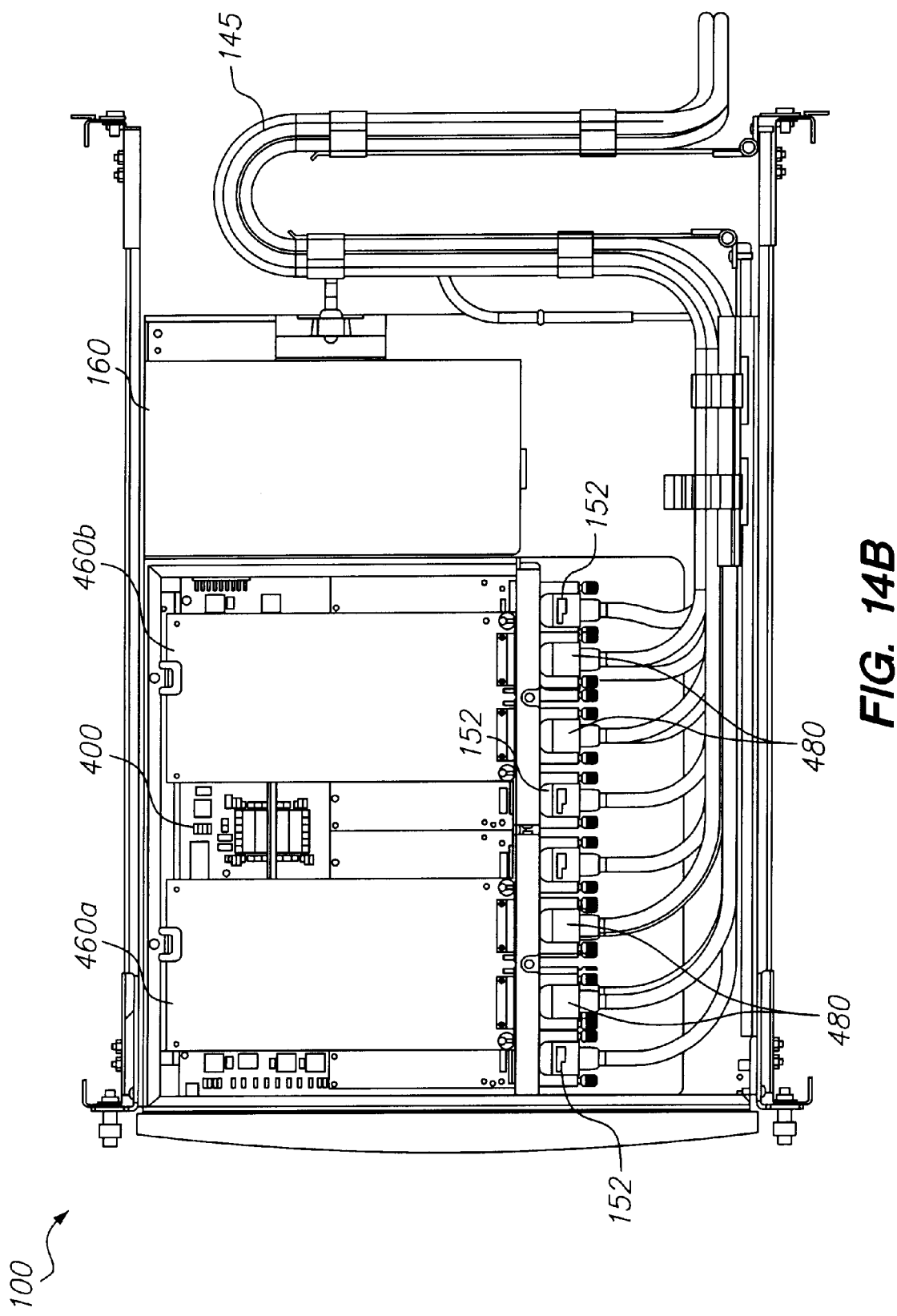

FIGS. 14a and 14b show various views of the chassis assembly 110 with cable connectors 480 coupled to the ports of the daughter-cards 460a and 460b. Thus, the I/O bulkhead 140 design permits support of an increased number of cables 145 and connectors, as compared to conventional chassis designs.

Figure 15:
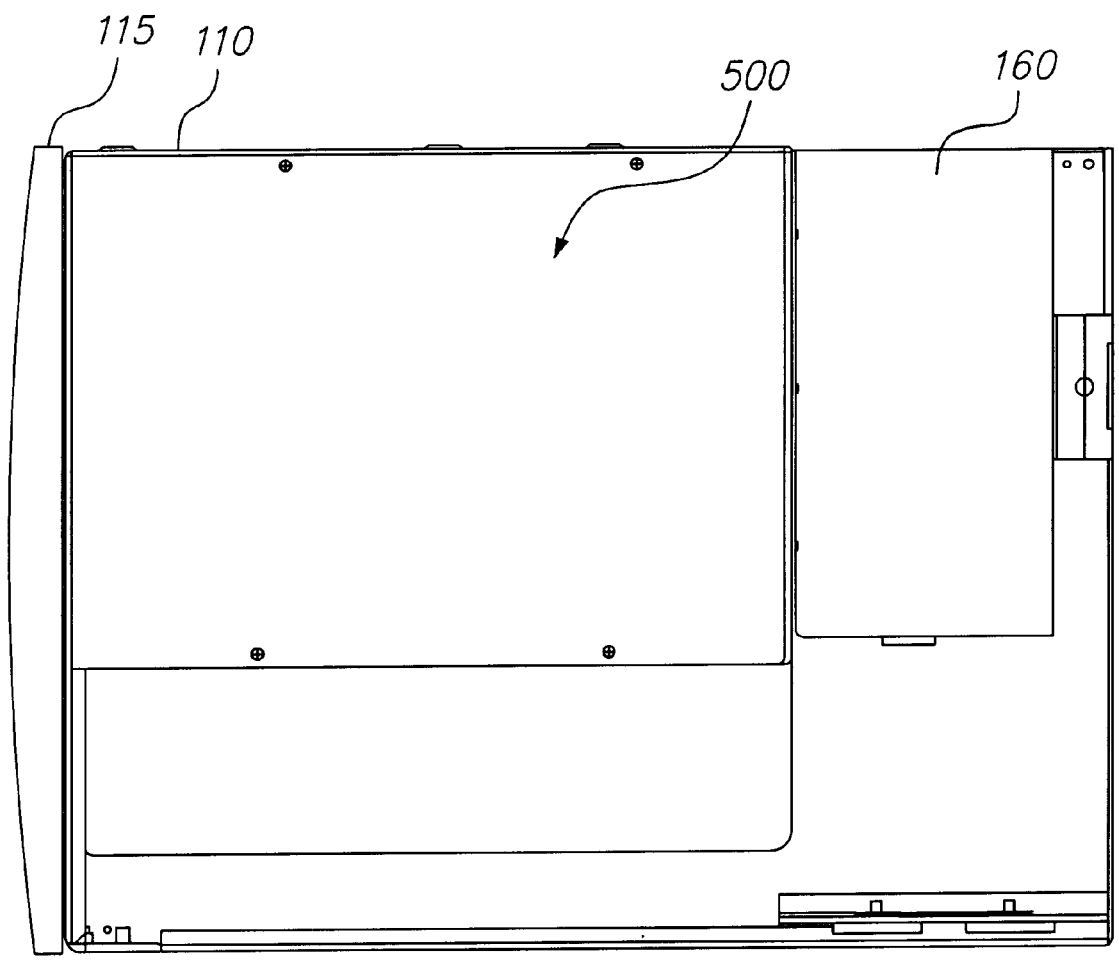
FIG. 15 is a top view of a chassis assembly in accordance with an embodiment of the present invention, wherein a top cover has been attached to the chassis assembly box portion to form an electronically tight box (i.e., a Faraday cage).

FIG. 15 is a top view of the chassis assembly 110 with a cover 100 installed on the box portion of the chassis assembly. The cover 100 is placed above the chassis box portion 405 (FIG. 13a) which contains the electronic components including the PWBs.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope of the invention as set forth.

What is claimed is:

1. An apparatus for supporting cable lines and containing electronic components, comprising:
    a chassis assembly including a base with a defined opening;
    a bulkhead coupled to the base and located adjacent to the defined opening, the bulkhead including a plurality of apertures for supporting ports; and
    a motherboard mounted on the base of the chassis assembly.

2. The apparatus of claim 1 wherein the bulkhead is formed from the base of the chassis assembly.

3. The apparatus of claim 1 wherein the bulkhead includes airflow apertures for receiving a flow of air.

4. The apparatus of claim 1 further comprising:
    a compartment mounted on the base of the chassis assembly and substantially perpendicular to the bulkhead, the compartment and the bulkhead defining a box portion of the chassis assembly.

5. The apparatus of claim 4 wherein the box portion is capable of containing electronic components.

6. The apparatus of claim 4 wherein the compartment includes an attachment for a blind-pluggable power supply.

7. The apparatus of claim 6 wherein the power supply includes air movers.

8. The apparatus of claim 5 wherein the chassis assembly further includes a front portion having airflow apertures so that air can flow from the front portion and across the box portion of the chassis assembly.

9. The apparatus of claim 1 wherein the chassis assembly is mounted on a slidable rack.

10. The apparatus of claim 1 wherein the chassis assembly permits a straight direction flow of air.

11. The apparatus of claim 1 wherein the chassis assembly receives airflow from at least two air movers.

12. The apparatus of claim 1 wherein cables may be routed near the defined opening of the chassis assembly.

13. The apparatus of claim 10 further comprising:
    a first plurality of ports coupled to the motherboard and disposed through selected apertures in the bulkhead.

14. The apparatus of claim 13 further comprising:
    a router application specific integrated circuit (ASIC) mounted on the motherboard.

15. The apparatus of claim 13 further comprising:
    a daughter card mounted on the motherboard.

16. The apparatus of claim 15 further comprising:
    a second plurality of ports coupled to the daughter card and disposed through selected apertures in the bulkhead.

17. The apparatus of claim 1 wherein at least twelve ports are disposed through apertures in the bulkhead.

18. The apparatus of claim 1 wherein the chassis assembly is mounted on a flat supporting surface.

19. A method of forming an electronic assembly, comprising:
    forming a chassis assembly from a metal sheet, the chassis assembly including a base with a defined opening;
    forming a bulkhead from the base and adjacent to the defined opening, the bulkhead including a plurality of apertures for receiving ports; and
    mounting a motherboard on the base of the chassis assembly.

20. The method of claim 19 further comprising:
    forming airflow apertures on the bulkhead.

21. The method of claim 19 further comprising:
    forming a compartment from the base of the chassis assembly so that the compartment and the bulkhead define a box portion for containing electronic components.

22. The method of claim 19 further comprising:
    forming airflow apertures on a front panel of the chassis assembly.

23. The method of claim 21 further comprising:
    providing printed wiring boards within the box portion of the chassis assembly.

* * * * *

UNITED STATES PATENT AND TRADEMARK OFFICE
CERTIFICATE OF CORRECTION

PATENT NO.   : 6,219,235 B1
DATED        : April 17, 2001
INVENTOR(S)  : Randal J. Diaz and Perry L. Hayden It is certified that error appears in the above-identified patent and that said Letters Patent is hereby corrected as shown below:

<u>Claim 13,</u>
Line 27, replace "10" with -- 1 --.

Signed and Sealed this

Twenty-eighth Day of August, 2001

*Attest:*

*Nicholas P. Godici*

*Attesting Officer*

NICHOLAS P. GODICI
*Acting Director of the United States Patent and Trademark Office*